(12) United States Patent
Hayashi et al.

(10) Patent No.: US 11,201,571 B2
(45) Date of Patent: Dec. 14, 2021

(54) METHOD OF MANUFACTURING AN OSCILLATOR

(71) Applicant: CANON KABUSHIKI KAISHA, Tokyo (JP)

(72) Inventors: Jumpei Hayashi, Yokohama (JP); Kenichi Takeda, Yokohama (JP); Shinya Koyama, Tokyo (JP); Takayuki Watanabe, Yokohama (JP); Yasushi Shimizu, Fujisawa (JP); Tatsuo Furuta, Machida (JP); Miki Ueda, Tokyo (JP); Akira Uebayashi, Tokyo (JP); Hidenori Tanaka, Tokyo (JP); Makoto Kubota, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 235 days.

(21) Appl. No.: 16/086,163

(22) PCT Filed: Mar. 21, 2017

(86) PCT No.: PCT/JP2017/012214
§ 371 (c)(1),
(2) Date: Sep. 18, 2018

(87) PCT Pub. No.: WO2017/164413
PCT Pub. Date: Sep. 28, 2017

(65) Prior Publication Data
US 2019/0115853 A1    Apr. 18, 2019

(30) Foreign Application Priority Data

Mar. 25, 2016 (JP) .............................. JP2016-061295

(51) Int. Cl.
*H04R 17/00* (2006.01)
*H02N 2/00* (2006.01)
(Continued)

(52) U.S. Cl.
CPC ............. *H02N 2/22* (2013.01); *H01L 41/042* (2013.01); *H01L 41/0477* (2013.01);
(Continued)

(58) Field of Classification Search
CPC ............... H01L 41/042; H01L 41/0477; H01L 41/0973; H01L 41/1871; H01L 41/257;
(Continued)

(56) References Cited

U.S. PATENT DOCUMENTS

| | | | |
|---|---|---|---|
| 5,036,419 A * | 7/1991 | Okauchi | H01L 41/094 360/291.9 |
| 6,288,475 B1 * | 9/2001 | Ito | H02N 2/147 310/323.01 |

(Continued)

FOREIGN PATENT DOCUMENTS

| JP | 10-193623 A | 7/1998 |
|---|---|---|
| JP | 2004-297910 A | 10/2004 |

(Continued)

OTHER PUBLICATIONS

Notice of Reasons for Refusal in Japanese Application No. 2017-059612 (dated Nov. 2020).

*Primary Examiner* — Paul D Kim
(74) *Attorney, Agent, or Firm* — Venable LLP

(57) ABSTRACT

Provided is a method of manufacturing an oscillator, including: arranging an electrode on a piezoelectric ceramics free from being subjected to polarization treatment, to thereby provide a piezoelectric element; bonding the piezoelectric element and a diaphragm to each other at a temperature T1; bonding the piezoelectric element and a power supply member to each other at a temperature T2; and subjecting the piezoelectric ceramics to polarization treatment at a
(Continued)

temperature T3, in which the temperature T1, the temperature T2, and the temperature T3 satisfy a relationship T1>T3 and a relationship T2>T3.

14 Claims, 7 Drawing Sheets

(51) Int. Cl.
*H01L 41/187* (2006.01)
*H01L 41/257* (2013.01)
*H02N 2/02* (2006.01)
*H01L 41/04* (2006.01)
*H01L 41/047* (2006.01)
*H01L 41/09* (2006.01)
*H01L 41/29* (2013.01)
*H01L 41/313* (2013.01)
*H02N 2/06* (2006.01)
*H02N 2/08* (2006.01)
*G02B 7/04* (2021.01)

(52) U.S. Cl.
CPC ...... *H01L 41/0973* (2013.01); *H01L 41/1871* (2013.01); *H01L 41/257* (2013.01); *H01L 41/29* (2013.01); *H01L 41/313* (2013.01); *H02N 2/0015* (2013.01); *H02N 2/026* (2013.01); *H02N 2/065* (2013.01); *H02N 2/08* (2013.01); *G02B 7/04* (2013.01)

(58) Field of Classification Search
CPC ..... H01L 41/29; H01L 41/313; H02N 2/0015; H02N 2/026; H02N 2/065; H02N 2/08; H02N 2/22; G02B 7/04
See application file for complete search history.

(56) References Cited

U.S. PATENT DOCUMENTS

| | | | |
|---|---|---|---|
| 7,661,180 B2 * | 2/2010 | Mita | B41J 2/1623 29/25.35 |
| 8,955,947 B2 | 2/2015 | Watanabe et al. | |
| 9,022,534 B2 | 5/2015 | Yabuta et al. | |
| 9,082,976 B2 | 7/2015 | Kubota et al. | |
| 9,172,313 B2 | 10/2015 | Ohashi et al. | |
| 9,196,819 B2 | 11/2015 | Watanabe et al. | |
| 9,231,188 B2 | 1/2016 | Suzuki et al. | |
| 9,252,685 B2 | 2/2016 | Ifuku et al. | |
| 9,306,149 B2 | 4/2016 | Hayashi et al. | |
| 9,343,650 B2 | 5/2016 | Kubota et al. | |
| 9,412,931 B2 | 8/2016 | Shimada et al. | |
| 9,509,235 B2 * | 11/2016 | Furuta | H01L 41/18 |
| 9,519,140 B2 | 12/2016 | Shimizu et al. | |
| 9,614,141 B2 | 4/2017 | Shimizu et al. | |
| 9,647,576 B2 | 5/2017 | Ohashi et al. | |
| 9,755,136 B2 | 9/2017 | Koyama et al. | |
| 9,768,375 B2 | 9/2017 | Watanabe et al. | |
| 9,842,985 B2 | 12/2017 | Suzuki et al. | |
| 9,871,188 B2 | 1/2018 | Hayashi et al. | |
| 9,893,268 B2 | 2/2018 | Matsuda et al. | |
| 9,893,269 B2 | 2/2018 | Ifuku et al. | |
| 9,917,245 B2 | 3/2018 | Kubota et al. | |
| 10,199,559 B2 * | 2/2019 | Kitada | B41J 2/14233 |
| 10,593,864 B2 * | 3/2020 | Furuta | C04B 35/63416 |
| 2010/0140379 A1 * | 6/2010 | Suzuki | H01L 41/273 239/569 |
| 2014/0124695 A1 | 5/2014 | Koyama et al. | |
| 2015/0349666 A1 | 12/2015 | Ifuku et al. | |
| 2017/0101345 A1 | 4/2017 | Shimada et al. | |
| 2019/0077150 A1 * | 3/2019 | Nishiwaki | H01L 41/0815 |

FOREIGN PATENT DOCUMENTS

| | | |
|---|---|---|
| JP | 2010-30180 A | 2/2010 |
| JP | 2012-44832 A | 3/2012 |
| JP | 2014-14256 A | 1/2014 |
| JP | 2014-128114 A | 7/2014 |
| JP | 2014-216851 A | 11/2014 |
| JP | 2015-163577 A | 9/2015 |

* cited by examiner

METHOD OF MANUFACTURING AN OSCILLATOR

TECHNICAL FIELD

The present invention relates to a method of manufacturing an oscillator, and a method of manufacturing an oscillatory wave driving apparatus and a method of manufacturing an optical apparatus which use the method of manufacturing an oscillator.

BACKGROUND ART

In a piezoelectric device, such as an ultrasonic motor and an ink jet head, a piezoelectric oscillator including a diaphragm and a piezoelectric ceramics bonded to each other is used. As an example of the application of the piezoelectric oscillator to an ultrasonic motor, in PTL 1, there is disclosed that an oscillation type driving apparatus (ultrasonic motor) is driven with composite oscillation of a combination of two different oscillation modes (traveling waves).

Meanwhile, when such piezoelectric oscillator is manufactured, it is required that an adhesive be cured at a temperature of 100° C. or more in order to reliably bond the diaphragm and the piezoelectric ceramics to each other. However, when the piezoelectric ceramics subjected to polarization treatment is exposed to a temperature of 100° C. or more, there is a risk in that the piezoelectric ceramics may cause depolarization. In view of the foregoing, in PTL 2, there is disclosed a manufacturing method involving subjecting the piezoelectric ceramics to polarization treatment again after various heat treatments so that the piezoelectric ceramics does not cause depolarization.

CITATION LIST

Patent Literature

PTL 1: Japanese Patent Application Laid-Open No. 2004-297910
PTL 2: Japanese Patent Application Laid-Open No. H10-193623

SUMMARY OF INVENTION

Technical Problem

However, when an attempt is made to manufacture the piezoelectric oscillator as disclosed in PTL 1 by the manufacturing method disclosed in PTL 2, the polarization treatment is performed at a temperature higher than a bonding temperature in spite of the fact that the adhesive is cured at 100° C. or more. Therefore, a heat-sensitive components or the adhesive is softened during the polarization treatment, with the result that positional displacement may occur between the piezoelectric ceramics and the diaphragm. When the piezoelectric oscillator having positional displacement is used in the ultrasonic motor, there has been a problem in that driving characteristics (for example, a driving frequency, a driving speed, power consumption) do not become equivalent between a forward direction and a backward direction.

The present invention has been made to solve the above-mentioned problem, and it is an object of the present invention to provide a method capable of manufacturing a piezoelectric oscillator, in which the oscillation characteristics are substantially equivalent between the forward direction and the backward direction, with good yield.

Solution to Problem

A method of manufacturing an oscillator according to one embodiment of the present invention is a method of manufacturing an oscillator including: arranging an electrode on a piezoelectric ceramics free from being subjected to polarization treatment, to thereby provide a piezoelectric element; bonding the piezoelectric element and a diaphragm to each other at a temperature $T1$; bonding the piezoelectric element and a power supply member to each other at a temperature $T2$; and subjecting the piezoelectric ceramics to polarization treatment at a temperature $T3$, in which the temperature $T1$, the temperature $T2$, and the temperature $T3$ satisfy a relationship $T1>T3$ and a relationship $T2>T3$.

A method of manufacturing an oscillatory wave driving apparatus according to another embodiment of the present invention is a method of manufacturing an oscillatory wave driving apparatus including an oscillator, a body to be driven, and a voltage input unit. The method includes: manufacturing the oscillator by the above-mentioned method of manufacturing an oscillator; and arranging the body to be driven so that the body to be driven is brought into contact with the diaphragm.

A method of manufacturing an optical apparatus according to still another embodiment of the present invention is a method of manufacturing an optical apparatus including an oscillatory wave driving apparatus and an optical member. The method includes: manufacturing the oscillatory wave driving apparatus by the above-mentioned method of manufacturing an oscillatory wave driving apparatus; and dynamically connecting the oscillatory wave driving apparatus and the optical member to each other.

Advantageous Effects of Invention

According to the present invention, the oscillator in which oscillation characteristics are substantially equivalent between a forward direction and a backward direction can be provided with good yield. Further, the oscillatory wave driving apparatus and the optical apparatus in each of which driving characteristics are equivalent between the forward direction and the backward direction can be provided with good yield.

Further features of the present invention will become apparent from the following description of exemplary embodiments with reference to the attached drawings.

DESCRIPTION OF EMBODIMENTS

Preferred embodiments of the present invention will now be described in detail in accordance with the accompanying drawings.

A method of manufacturing an oscillator of the present invention includes, in sequence:
arranging an electrode on a piezoelectric ceramics free from being subjected to polarization treatment, to thereby provide a piezoelectric element;
bonding the piezoelectric element and a diaphragm to each other at a temperature T1;
bonding the piezoelectric element and a power supply member to each other at a temperature T2; and
subjecting the piezoelectric ceramics to polarization treatment at a temperature T3,
in which the temperature T1, the temperature T2, and the temperature T3 satisfy a relationship T1>T3 and a relationship T2>T3.

As a specific example, the following manufacturing method is given.

There is provided a method of manufacturing an oscillator including: a piezoelectric element that includes a piezoelectric ceramics subjected to polarization treatment and a first electrode and a second electrode arranged so as to be brought into contact with the piezoelectric ceramics; a diaphragm arranged through intermediation of a first adhesive portion that is held in contact with the first electrode; and a power supply member arranged through intermediation of a second adhesive portion that is held in contact with the second electrode. The method includes, in sequence: arranging the first electrode and the second electrode on a piezoelectric ceramics free from being subjected to polarization treatment, to thereby provide a piezoelectric element; forming the first adhesive portion between the first electrode and the diaphragm at a temperature T1 (unit: ° C.); forming the second adhesive portion between the second electrode and the power supply member at a temperature T2 (unit: ° C.); and subjecting the piezoelectric ceramics to polarization treatment at a temperature T3 (unit: ° C.), in which the temperature T1, the temperature T2, and the temperature T3 satisfy a relationship T1>T3 and a relationship T2>T3.

A piezoelectric oscillator in which oscillation characteristics are equivalent between a forward direction and a backward direction can be manufactured with good yield by the above-mentioned manufacturing method.

Figure 1:
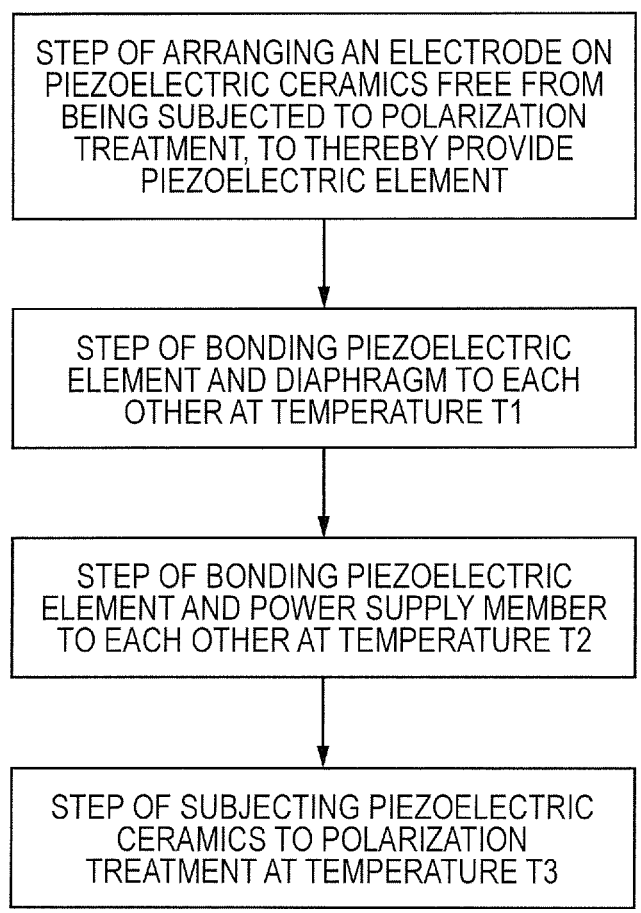
FIG. 1 is a diagram for illustrating a manufacturing flow of a method of manufacturing an oscillator according to one embodiment of the present invention.
Figure 2:
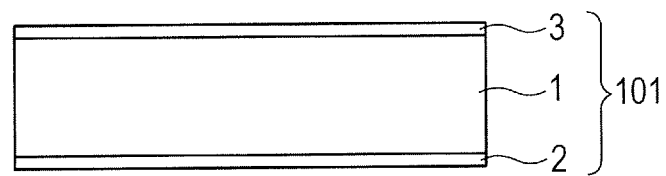
FIG. 2 is a schematic view for illustrating an embodiment of a piezoelectric element in which a first electrode and a second electrode are arranged on a piezoelectric ceramics free from being subjected to polarization treatment.

FIG. 1 is a diagram for illustrating a manufacturing flow of the method of manufacturing an oscillator of the present invention. Further, FIG. 2 is a schematic view for illustrating an embodiment of a piezoelectric element in which electrodes are arranged on a piezoelectric ceramics free from being subjected polarization treatment. A piezoelectric element 101 includes a piezoelectric ceramics 1 free from being subjected to polarization treatment, on which a first electrode 2 and a second electrode 3 are arranged. Like reference symbols denote like members below.

(Piezoelectric Ceramics)

The piezoelectric ceramics 1 is a bulk (sintered compact) having a uniform composition obtained by firing raw material powder containing metal elements and is a ceramics that exhibits an absolute value of a piezoelectric constant $d_{31}$ of 10 pm/V or more or a piezoelectric constant $d_{33}$ of 30 pC/N or more at 20° C. when being subjected to polarization treatment. In terms of potentially having piezoelectric characteristics, a non-polarized ceramics is also hereinafter referred to as "piezoelectric ceramics".

The ceramics free from being subjected to polarization treatment refers to a ceramics that has an absolute value of the piezoelectric constant $d_{31}$ of less than 10 pm/V and a piezoelectric constant $d_{33}$ of less than 30 pC/N at 20° C. As described later, from the viewpoint of reducing variations in characteristics of the oscillator, the piezoelectric constant of the piezoelectric ceramics free from being subjected to polarization treatment more preferably fall within a range of an absolute value of the piezoelectric constant $d_{31}$ of less than 4 pm/V and a piezoelectric constant $d_{33}$ of less than 10 pC/N.

The ceramics is generally a collection of fine crystals (sometimes referred to as "polycrystal"), and each crystal is formed of atoms having positive charge and atoms having negative charge. Most of the ceramics have a state in which the positive charge and the negative charge have a satisfactory balance. However, of dielectric ceramics, there is a ferroelectric ceramics in which the positive charge and the negative charge do not have a satisfactory balance in crystals even in a natural state, and the bias (spontaneous polarization) of the charge occurs. In a ferroelectric ceramics free from being subjected to polarization treatment, the direction of the spontaneous polarization is random, and it appears that there is no bias of the charge in the ceramics as a whole. However, when a high voltage is applied to the ferroelectric ceramics free from being subjected to polarization treatment, the direction of the spontaneous polarization is aligned in a uniform direction and does not return to the original direction even when the voltage is removed. The alignment of the direction of the spontaneous polarization as described above is referred to as "polarization treatment".

Here, whether or not the piezoelectric ceramics has been subjected to polarization treatment may be determined by arranging electrodes on the piezoelectric ceramics and measuring a piezoelectric constant of the piezoelectric ceramics. The piezoelectric constant of the piezoelectric ceramics may be determined based on the density, resonant frequency, and antiresonant frequency of the piezoelectric ceramics by calculation under Japan Electronics and Information Technology Industries Association Standards (JEITA EM-4501). This method is hereinafter referred to as "resonant-antiresonant method".

The density may be measured by, for example, the Archimedes method. The resonant frequency and the antiresonant frequency may be measured through use of an impedance analyzer. Further, besides the resonant-antiresonant method, the resonant frequency and the antiresonant frequency may also be measured with a piezoelectric constant measurement device employing the Berlincourt method as a measurement principle.

When the piezoelectric ceramics is not subjected to polarization treatment, variations in oscillation characteristics of the piezoelectric oscillator are small when the piezoelectric oscillator is obtained by the method of the present invention. Here, the oscillation characteristics refer to a displacement amplitude and a resonant frequency of the oscillator. Meanwhile, when a piezoelectric ceramics subjected to polarization treatment is used, the piezoelectric constant of the piezoelectric ceramics fluctuates in various heating steps described later. Further, it is difficult to control the fluctuation amount thereof, and hence the piezoelectric constant of the piezoelectric ceramics has a large variation in a stage before the step of performing polarization treatment described later. Therefore, the oscillation characteristics of the piezoelectric oscillator after being subjected to polarization treatment also have large variations.

(First Electrode and Second Electrode)

The first electrode 2 and the second electrode 3 are each formed of a conductive material having a thickness of from about 5 nm to about 10 μm. There is no particular limitation on the material, and a metal, for example, Ti, Pt, Au, Ni, Pd, Ag, or Cu and a compound thereof may be used. From the viewpoints of low cost and sufficient conductivity, a silver paste is preferred. The first electrode 2 and the second electrode 3 formed of the silver paste may be formed by applying the silver paste onto a piezoelectric ceramics in a desired pattern, followed by drying or baking the silver paste. Here, the first electrode 2 may be used as, for example, a ground electrode, and the second electrode 3 may be used as, for example, a drive phase electrode.

Figure 3:
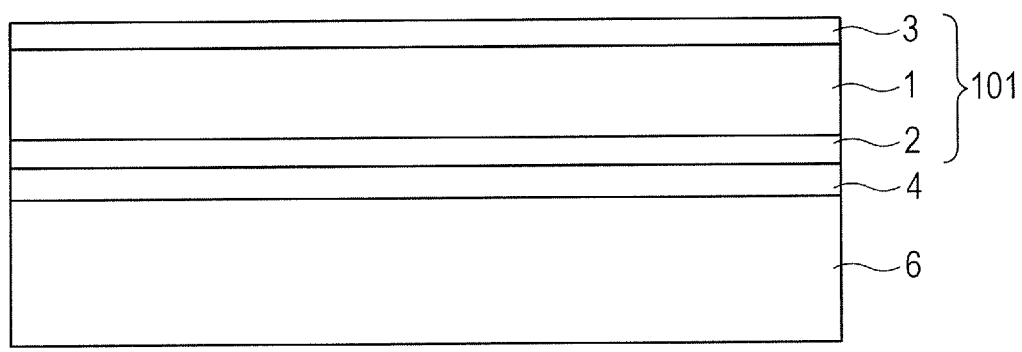
FIG. 3 is a schematic view for illustrating an embodiment in which a diaphragm is arranged on the piezoelectric element.

Next, as illustrated in FIG. 3, a first adhesive portion 4 is formed between the first electrode 2 and a diaphragm 6 at a temperature T1 (unit: ° C.).

FIG. 3 is a schematic view for illustrating an embodiment in which the diaphragm is arranged on the piezoelectric element, and the piezoelectric element 101 and the diaphragm 6 are arranged through intermediation of the first adhesive portion 4. The reason for this is to integrate the diaphragm 6 and the piezoelectric element 101 with each other to form traveling waves of bending oscillation in an out-of-plane direction (hereinafter referred to as "out-of-plane oscillation"). Here, the first electrode 2 of the piezoelectric element 101 is held in contact with the first adhesive portion 4. The first adhesive portion 4 is obtained by curing an adhesive, and an epoxy-based resin is preferably used as the adhesive.

The temperature T1 is set to a temperature at which the adhesive is cured within a short time period and the first adhesive portion 4 has sufficient adhesive strength. Specifically, the temperature T1 is 20° C. or more, preferably 80° C. or more, more preferably 120° C. or more. When the temperature T1 is 600° C. or more, there is a risk in that the diaphragm 6 may be altered. Therefore, it is preferred that the temperature T1 be less than 600° C. The temperature T1 does not mean environment temperature but the temperature of the piezoelectric element 101, and may be measured through use of a thermocouple or a radiation thermometer. T2 and T3 described later similarly refer to the temperature of the piezoelectric element 101 in the same manner as T1.

It is preferred that the piezoelectric element 101 and the diaphragm 6 be arranged so that centers of their respective adhesive surfaces are matched with each other. With this, the oscillation characteristics become equivalent between the forward direction and the backward direction, and the yield of the piezoelectric oscillator becomes higher.

Figure 4A:
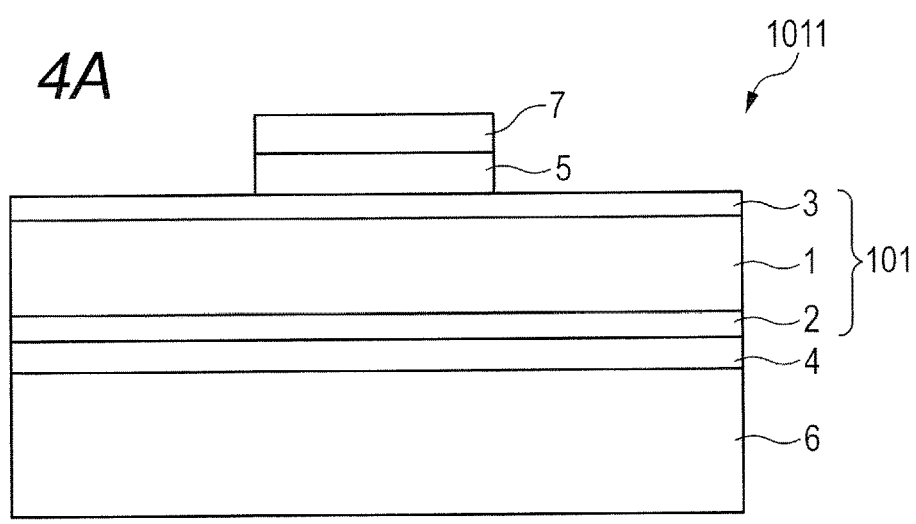
FIG. 4A is a schematic view for illustrating an embodiment of a piezoelectric oscillator in which a power supply member is arranged on a second electrode of the piezoelectric element.

Next, as illustrated in FIG. 4A, a second adhesive portion 5 is formed between the second electrode 3 and a power supply member 7 at a temperature T2 (unit: ° C.).

Figure 4B:
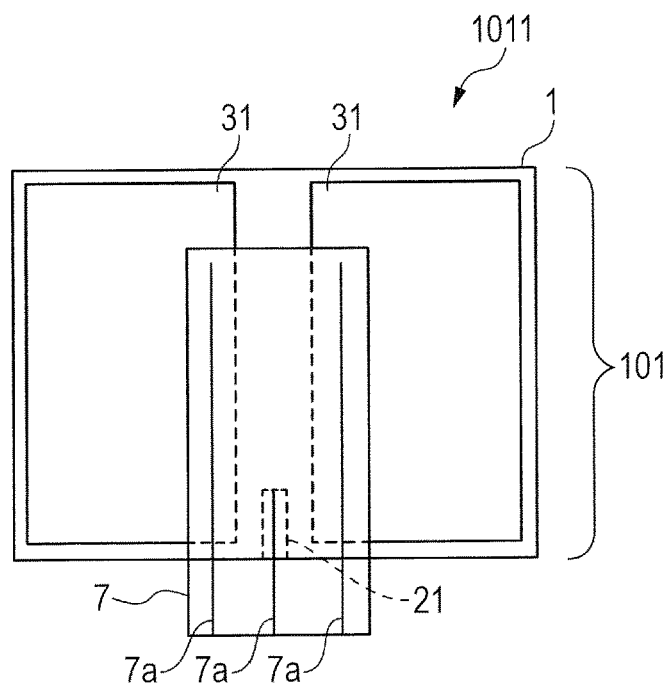
FIG. 4B is a schematic view for illustrating an embodiment of a piezoelectric oscillator in which a power supply member is arranged on a second electrode of the piezoelectric element.
Figure 4C:
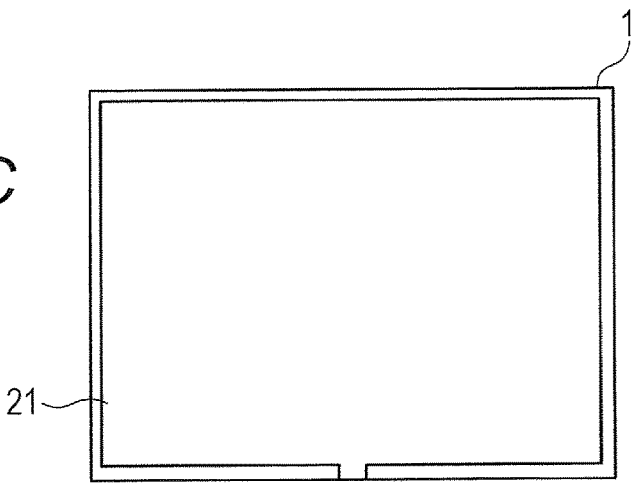
FIG. 4C is a schematic view for illustrating an embodiment of a piezoelectric oscillator in which a power supply member is arranged on a second electrode of the piezoelectric element.

FIG. 4A to FIG. 4C are each a schematic view for illustrating an embodiment of a piezoelectric oscillator 1011 in which the power supply member 7 is arranged on the second electrode 3 of the piezoelectric element 101. As illustrated in FIG. 4A, the second electrode 3 and the power supply member 7 are arranged through intermediation of the second adhesive portion 5. FIG. 4B is a schematic view of the piezoelectric oscillator 1011 when viewed from the power supply member 7 side, and the second electrode 3 includes two drive phase electrodes 31. FIG. 4C is a schematic view of the piezoelectric oscillator 1011 when viewed from the first electrode 2 side. Here, a ground electrode 21 on the first electrode surface side is in electrical conduction with a ground electrode 21 on the second electrode surface side from the first electrode surface through a turn-around electrode. With such configuration, the ground electrode 21 and the two drive phase electrodes 31 can be brought into conduction with each other through use of one power supply member.

The piezoelectric element 101 is brought into conduction with a voltage input unit (e.g., a power source) (not shown) through electric wiring 7a in the power supply member 7. From the viewpoints of high dimensional accuracy and easy positioning, it is preferred that a flexible printed board be used as the power supply member 7. As a material for the flexible printed board, polyimide is preferred. When the second adhesive portion 5 is formed, the drive phase electrodes 31 and the ground electrode 21 are brought into conduction with the power supply member 7. As a material for the second adhesive portion 5, an anisotropic conductive paste (ACP) or an anisotropic conductive film (ACF) is preferred.

It is preferred that the temperature T2 for forming the second adhesive portion 5 satisfy a relationship T2≥Td with respect to a depolarization temperature Td (unit: ° C.) of the piezoelectric ceramics 1. When this relationship is satisfied, the piezoelectric constant of the piezoelectric ceramics 1 can be made as close as possible to 0. Here, the depolarization temperature Td refers to a temperature at which, when the temperature of the piezoelectric ceramics 1 is raised from room temperature (e.g., from 20° C. to 30° C.) to a certain temperature and lowered to room temperature after the piezoelectric ceramics 1 is subjected to polarization treatment and a sufficient time period elapses, the piezoelectric constant becomes smaller than that before the temperature is raised. In the present invention, the temperature at which the piezoelectric constant reaches less than 90% of that before the temperature is raised is referred to as "depolarization temperature Td".

The temperature T2 is defined as a temperature at which the adhesive is cured within a short time period and the second adhesive portion 5 has sufficient adhesive strength.

Specifically, the temperature T2 is 20° C. or more, preferably 100° C. or more, more preferably 140° C. or more. When the temperature T2 is 140° C. or more, the sufficient adhesive strength of the second adhesive portion 5 is obtained within from about 10 seconds to about 30 seconds. Further, it is preferred that the pressure for forming the second adhesive portion 5 by thermocompression bonding be 1 MPa/cm$^2$ or more. When the pressure is less than 1 MPa/cm$^2$, there is a risk in that so-called floating may occur.

It is preferred that the power supply member 7 be bonded to regions of the two drive phase electrodes 31 with equal areas. When an extreme area difference occurs, a difference is caused in the regions in which the power supply member 7 inhibits oscillation when the piezoelectric oscillator 1011 oscillates. As a result, there is a risk in that the oscillation characteristics may not become equivalent between the forward direction and the backward direction.

Then, the piezoelectric ceramics 1 is subjected to polarization treatment at a temperature T3 (unit: ° C.) to provide the piezoelectric oscillator 1011.

The polarization treatment is performed so that the piezoelectric constant of the piezoelectric ceramics 1 becomes sufficient. The temperature T3 for performing the polarization treatment in this case is set so as to satisfy a relationship T1>T3 and a relationship T2>T3. Here, the temperature T3 refers to the highest temperature when the piezoelectric ceramics 1 is subjected to the polarization treatment. The polarization treatment is described specifically. First, the piezoelectric ceramics 1 is placed in a polarization device at room temperature (e.g., 20° C.). Next, the temperature is raised to the temperature T3, and then a voltage is applied to the piezoelectric ceramics 1. The temperature is lowered to room temperature (e.g., 20° C.) while the voltage is applied to the piezoelectric ceramics 1. Then, the applied voltage is set to 0, to thereby complete the polarization treatment.

When the temperature T3 is higher than the temperature T1, the first adhesive portion 4 formed between the piezoelectric element 101 and the diaphragm 6 is softened, and the center of the adhesive surface of the piezoelectric element 101 and the center of the adhesive surface of the diaphragm 6 are displaced from each other, with the result that the oscillation characteristics do not become equivalent between the forward direction and the backward direction. Meanwhile, when the temperature T3 is higher than the temperature T2, the second adhesive portion 5 is softened, and the center line of the power supply member 7 and the center line in the long-side direction of the piezoelectric element 101 may be displaced from each other. Therefore, the manufacturing yield decreases. In this case, the power supply member 7 is not bonded to the regions of the two drive phase electrodes 31 with equal areas, and a difference is cased in the regions in which the power supply member 7 inhibits oscillation when the piezoelectric oscillator 1011 oscillates. As a result, there is a risk in that the oscillation characteristics may not become equivalent between the forward direction and the backward direction. Thus, it is preferred that the temperature T1, the temperature T2, and the temperature T3 have a relationship T1>T2>T3. With this, equivalent oscillation characteristics are obtained more reliably.

Further, it is preferred that the temperature T3, a glass transition temperature Tg1 of the first adhesive portion 4, and a glass transition temperature Tg2 of the second adhesive portion 5 satisfy a relationship Tg1>T3 and a relationship Tg2>T3. When the temperature T3 is equal to or more than the glass transition temperature Tg1 and the glass transition temperature Tg2, the first adhesive portion 4 and the second adhesive portion 5 are temporarily softened. When the temperature becomes lower than the glass transition temperature Tg1 and the glass transition temperature Tg2 at a time of completion of the polarization treatment, the first adhesive portion 4 and the second adhesive portion 5 are cured again. In this case, there is a risk in that the center of the adhesive surface of the piezoelectric element 101 and the center of the adhesive surface of the diaphragm 6 may be displaced from each other. The displacement of the centers may prevent the oscillation characteristics from becoming equivalent between the forward direction and the backward direction, which is not preferred.

A unit configured to apply a voltage to the piezoelectric ceramics 1 when the polarization treatment is performed is not particularly limited. A voltage may be applied to the piezoelectric ceramics 1 through the first electrode 2 and the second electrode 3 of the piezoelectric element 101 or through the power supply member 7. There is no particular limitation on the intensity of an electric field applied to the piezoelectric ceramics 1 when the polarization treatment is performed. However, from the viewpoint of performing the polarization treatment within a short time period, it is preferred that the intensity of the electric field be from 0.5 kV/mm to 2 kV/mm. Further, it is preferred that the temperature T3 be 20° C. or more. When the temperature T3 is lower than 20° C., a time period in which the piezoelectric ceramics 1 comes to have a sufficient piezoelectric constant may become long. From the viewpoint of finishing the polarization treatment within a short time period, the temperature T3 is preferably 100° C. or more, more preferably 120° C. or more.

(Composition and Physical Properties of Diaphragm)

The diaphragm 6 is formed of an elastic body. From the viewpoints of properties and processability, it is preferred that the material for the diaphragm 6 be a metal. As the metal that may be used in the diaphragm 6, there may be given aluminum, brass, stainless steel, and an Fe—Ni 36% alloy. Of those, from the viewpoint of ensuring the adhesive strength with respect to the piezoelectric element 101 through intermediation of the first adhesive portion 4, stainless steel is preferred. Here, stainless steel refers to an alloy containing 50 mass % or more of steel and 10.5 mass % or more of chromium. Of stainless steels, martensite-based stainless steel is preferred, and SUS420J2 is most preferred.

Further, it is preferred that the diaphragm 6 have a linear expansion coefficient as at 20° C. of $9.0 \times 10^{-6}$/° C. or more and $20.0 \times 10^{-6}$/° C. or less. When the value of the linear expansion coefficient as falls within this range, peeling is less liable to occur due to the difference in linear expansion between the diaphragm 6 and the piezoelectric ceramics 1 when the first adhesive portion 4 is formed between the first electrode 2 of the piezoelectric element 101 and the diaphragm 6 at the temperature T1. The linear expansion coefficient as may be determined through calculation, for example, by changing the temperature and measuring the strain through use of a strain gauge.

(Composition and Physical Properties of Piezoelectric Ceramics)

It is preferred that the piezoelectric ceramics 1 contain lead in a content of less than 1,000 ppm, that is, the piezoelectric ceramics 1 be a lead-free ceramics. Most of the related-art piezoelectric ceramics contain piezoelectric zirconate titanate (PZT) as a main component. Therefore, it has been pointed out that, for example, when the piezoelectric element is discarded to be exposed to acid rain or left in a severe environment, there is a risk in that the lead component in the piezoelectric ceramics seeps into soil, thereby adversely affecting the ecosystem. However, when the content of lead is less than 1,000 ppm, the effects of the lead component contained in the piezoelectric ceramics on the environment can be negligible even when the piezoelectric element is discarded to be exposed to acid rain or left in a severe environment. The content of lead contained in the piezoelectric ceramics may be evaluated based on the content of lead with respect to the total weight of the piezoelectric ceramics quantified by, for example, fluorescent X-ray analysis (XRF) or ICP emission spectrometric analysis.

It is preferred that a linear expansion coefficient ap at 20° C. of the piezoelectric ceramics 1 and the linear expansion coefficient αs at 20° C. of the diaphragm 6 satisfy a relationship $0.5 \leq \alpha s/\alpha p \leq 1.5$. That is, it is preferred that the linear expansion coefficient αs of the diaphragm 6 be 0.5 time or more and 1.5 times or less of the linear expansion coefficient ap of the piezoelectric ceramics 1. The reason for this is as follows. When the linear expansion coefficient ap and the linear expansion coefficient as do not satisfy the above-mentioned relationship, the difference in linear expansion between the diaphragm 6 and the piezoelectric ceramics 1 increases, and there is an increased risk in that peeling and positional displacement may occur between the piezoelectric element 101 and the diaphragm 6 when the temperature is returned to room temperature (e.g., from 20° C. to 30° C.) after various heating steps in the manufacturing method of the present invention.

Further, it is preferred that a Young's modulus Ys at 20° C. of the diaphragm 6 and a Young's modulus Yp at 20° C. of the piezoelectric ceramics 1 satisfy a relationship $0.5 \leq Ys/Yp \leq 2$. That is, it is preferred that the Young's modulus Ys of the diaphragm 6 be 0.5 time or more and 2 times or less of the Young's modulus Yp of the piezoelectric ceramics 1. The reason for this is as follows. When the Young's modulus Ys and the Young's modulus Yp do not satisfy the above-mentioned relationship, the difference in Young's modulus between the diaphragm 6 and the piezoelectric ceramics 1 increases excessively, and hence there is an increased risk in that peeling and positional displacement may occur between the piezoelectric element 101 and the diaphragm 6 when the polarization treatment is performed at the temperature T3. The Young's modulus Ys may be calculated by, for example, determining a gradient of a stress-strain curve diagram through a tensile test or a compression test. The Young's modulus Yp may be measured by, for example, a resonant-antiresonant method through use of an impedance analyzer.

There is no particular limitation on the composition of the piezoelectric ceramics 1. However, it is preferred that the piezoelectric ceramics 1 be formed of a barium titanate based material from the viewpoints that the barium titanate based material has a high piezoelectric constant and the piezoelectric ceramics 1 can be relatively easily manufactured trough use of this material. Here, the barium titanate based material refers to compositions such as barium titanate ($BaTiO_3$), barium calcium titanate (($Ba,Ca)TiO_3$), barium zirconate titanate ($Ba(Ti,Zr)O_3$), barium calcium zirconate titanate (($Ba,Ca)(Ti,Zr)O_3$), sodium niobate-barium titanate ($NaNbO_3$—$BaTiO_3$), bismuth sodium titanate-barium titanate (($Bi,Na)TiO_3BaTiO$—$BaTiO_3$), and bismuth potassium titanate-barium titanate (($Bi,K)TiO_3$—$BaTiO_3$), and materials containing those compositions as main components. Of those, from the viewpoint that both the piezoelectric constant and the mechanical quality factor of the piezoelectric ceramics can be achieved, it is preferred that the piezoelectric ceramics 1 contain barium calcium zirconate titanate (($Ba,Ca)(Ti,Zr)O_3$) or sodium niobate-barium titanate ($NaNbO_3$—$BaTiO_3$) as a main component. It is preferred that the piezoelectric ceramics 1 contain manganese and bismuth as elements other than the main components.

It is preferred that the depolarization temperature Td of the piezoelectric ceramics 1 be 120° C. or less. The reason for this is as follows. When the depolarization temperature Td is 120° C. or less, the piezoelectric constant of the piezoelectric ceramics 1 can be made as close as possible to 0 by the time of the step of forming the second adhesive portion 5.

(Function of Piezoelectric Oscillator)

It is preferred that, in the piezoelectric oscillator 1011 manufactured by the present invention, the piezoelectric ceramics 1 have a rectangular parallelepiped shape, and the piezoelectric oscillator 1011 be configured to generate composite oscillation of a combination of two out-of-plane oscillation modes in which nodal lines are substantially orthogonal to each other. Here, the rectangular parallelepiped shape includes a shape in which each side of a rectangular parallelepiped is chamfered as well as the rectangular parallelepiped.

Figure 5A:
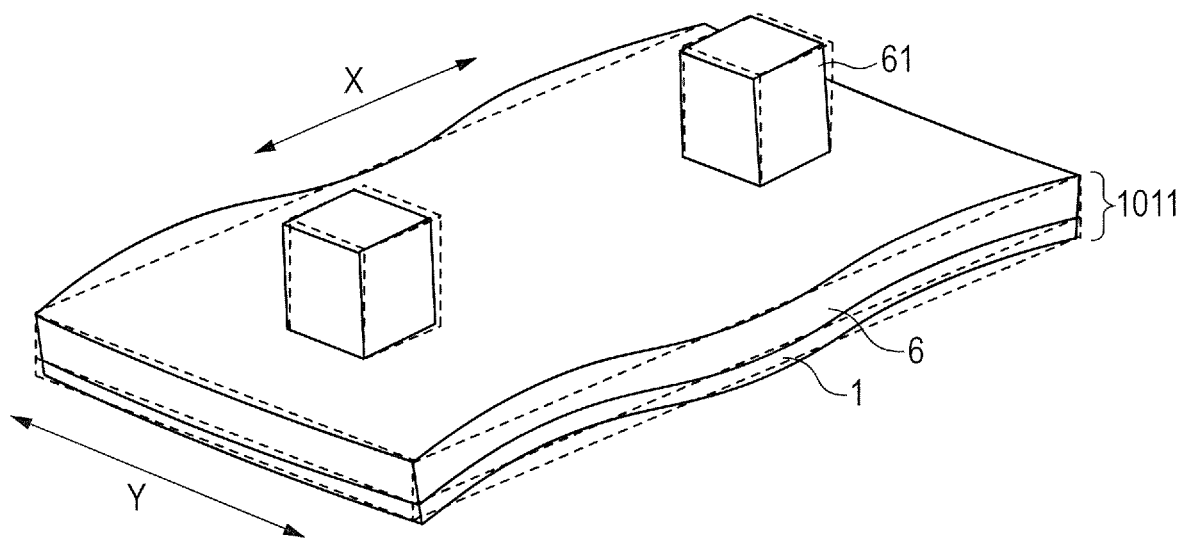
FIG. 5A is a schematic view for illustrating an embodiment of two out-of-plane oscillation modes.
Figure 5B:
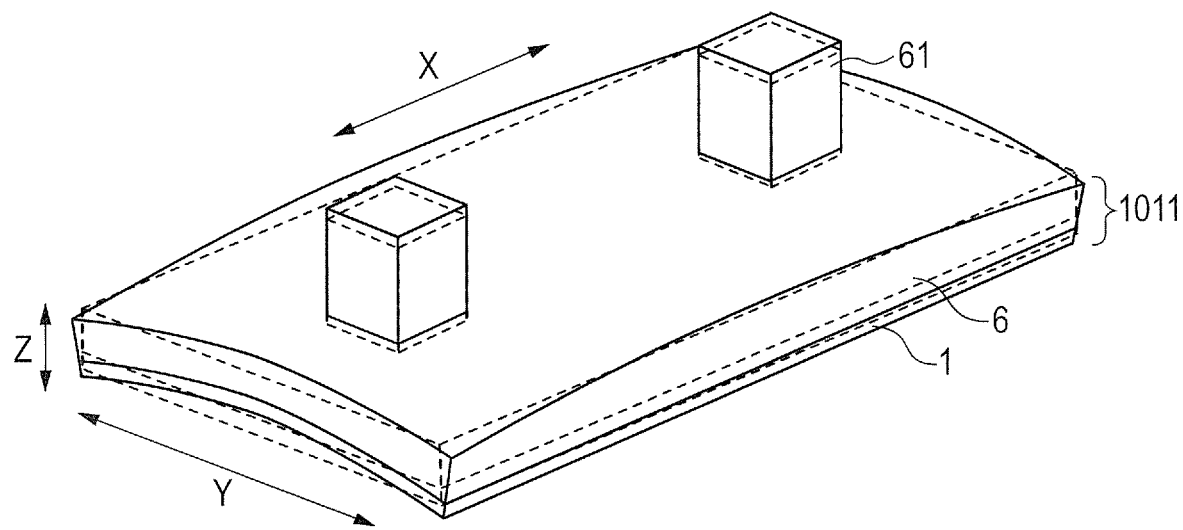
FIG. 5B is a schematic view for illustrating an embodiment of two out-of-plane oscillation modes.

Next, the two out-of-plane oscillation modes are described. FIG. 5A and FIG. 5B are each a schematic view for illustrating an embodiment of the two out-of-plane oscillation modes, and the diaphragm 6 has protrusions 61. When the diaphragm 6 has the protrusions 61, the oscillation generated by the piezoelectric oscillator 1011 can be efficiently transmitted to a contact body (for example, a body to be driven described later). The oscillation mode illustrated in FIG. 5A represents one out-of-plane oscillation mode (hereinafter referred to as "A-mode") of the two out-of-plane oscillation modes. The A-mode is secondary out-of-plane oscillation in the long-side direction (arrow X direction) of the piezoelectric oscillator 1011 having a rectangular parallelepiped shape (rectangular shape) and has three nodal lines parallel to the short-side direction (arrow Y direction).

The protrusions 61 are arranged in the vicinity of positions corresponding to nodes in the oscillation of the A-mode and perform reciprocating motion in the arrow X direction due to the oscillation of the A-mode. When the protrusions 61 are arranged as described above, the protrusions 61 can be most largely displaced in the arrow X direction.

Further, the oscillation mode illustrated in FIG. 5B represents the other out-of-plane oscillation mode (hereinafter referred to as "B-mode") of the two out-of-plane oscillation modes. The B-mode is primary out-of-plane oscillation in the short-side direction (arrow Y direction) of the piezoelectric oscillator 1011 having a rectangular parallelepiped shape (rectangular shape) and has two nodal lines parallel to the long-side direction (arrow X direction).

Further, the protrusions 61 are arranged in the vicinity of positions corresponding to antinodes in the oscillation of the B-mode and perform reciprocating motion in the arrow Z direction due to the oscillation of the B-mode. When the protrusions 61 are arranged as described above, the protrusions 61 can be most largely displaced in the arrow Z direction.

Here, the nodal lines in the A-mode and the nodal lines in the B-mode are substantially orthogonal to each other in the XY-plane.

When the nodal lines in the A-mode and the nodal lines in the B-mode are set to be substantially orthogonal to each other as described above, the positions of the nodes in the A-mode and the positions of the antinodes in the B-mode can be matched with each other. As a result, when the protrusions 61 are arranged, the composite oscillation generated by the combination of the two out-of-line oscillation modes can maximize oscillation displacement in the protrusions 61.

It is preferred that, in the piezoelectric oscillator manufactured by the present invention, the piezoelectric element include two electrodes in portions with which the power supply member is brought into contact, and the polarities of the piezoelectric ceramics in the portions that are brought into contact with the two electrodes be the same. Here, the two electrodes refer to drive phase electrodes.

Figure 6:
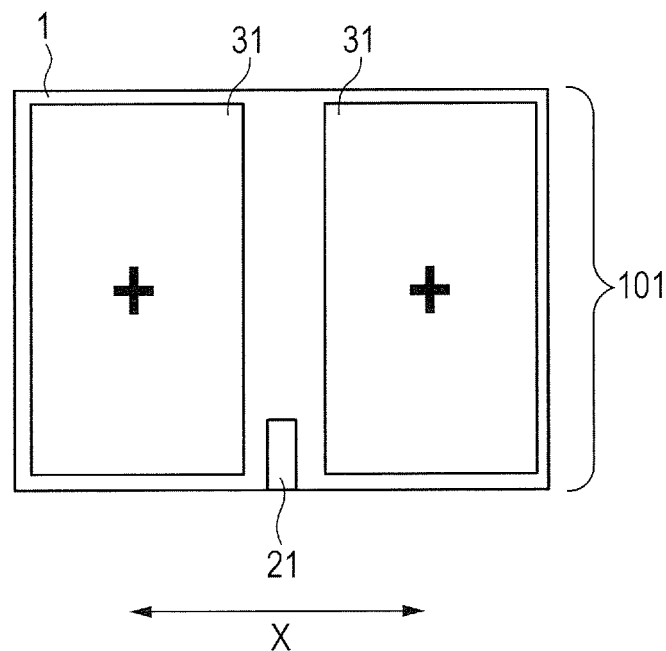
FIG. 6 is a schematic view for illustrating an embodiment of an electrode pattern of the piezoelectric element.

FIG. 6 is a schematic view for illustrating an embodiment of an electrode pattern of the piezoelectric element. As illustrated in FIG. 6, the drive phase electrodes 31 divided into two in the long-side direction (arrow X direction) are formed in the piezoelectric element 101. Further, the polarization direction in each of the drive phase electrodes 31 is the same direction ("+").

The polarization direction is aligned in the same direction over the entire piezoelectric element 101, and hence the polarization treatment can be performed easily from the viewpoint that a simple mechanism can be used as the polarization device as compared to a piezoelectric element having different polarization directions. Further, the stiffness of the piezoelectric element 101 in the vicinity of the boundary with respect to the drive phase electrodes 31 becomes uniform, and the risk in that the oscillation characteristics of the piezoelectric oscillator may not become equivalent between the forward direction and the backward direction can be reduced.

(Method of Manufacturing Oscillatory Wave Driving Apparatus)

A method of manufacturing an oscillatory wave driving apparatus of the present invention is a method of manufacturing an oscillatory wave driving apparatus including a piezoelectric oscillator, a body to be driven, and a voltage input unit. The method includes: manufacturing the piezoelectric oscillator by the above-mentioned method of manufacturing a piezoelectric oscillator; and arranging the body to be driven so that the body to be driven is brought into contact with the diaphragm.

Figure 7:
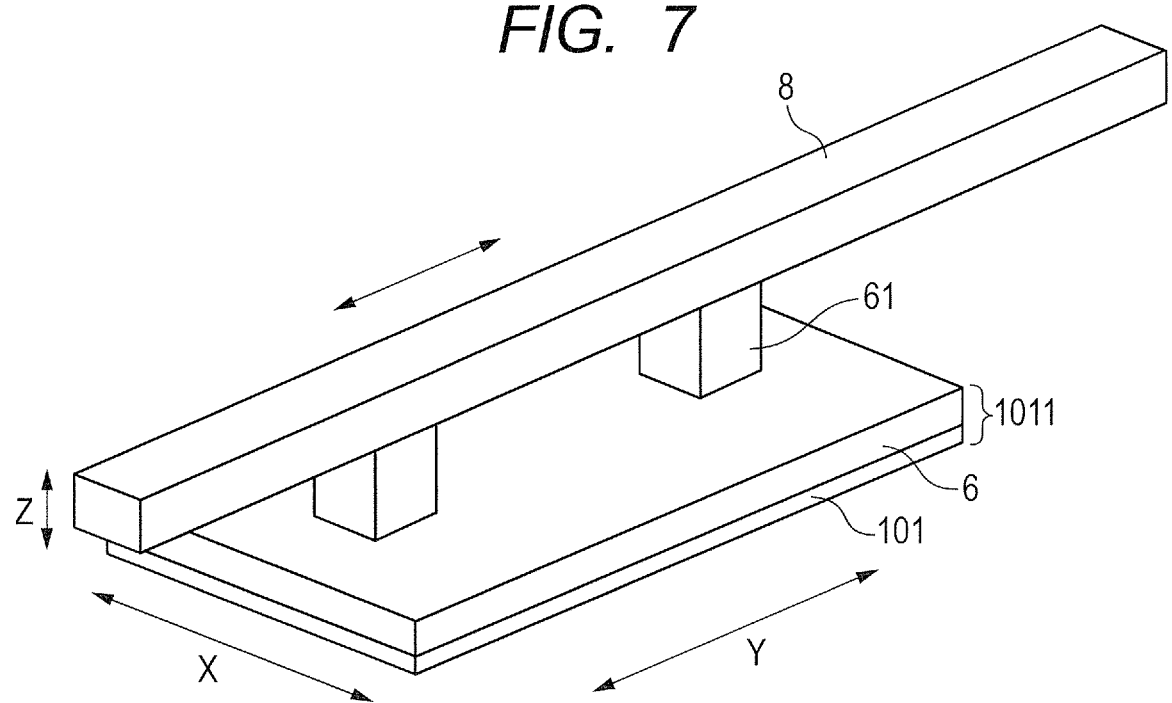
FIG. 7 is a schematic view for illustrating an oscillatory wave driving apparatus manufactured by a method of manufacturing an oscillatory wave driving apparatus according to one embodiment of the present invention.
Figure 8:
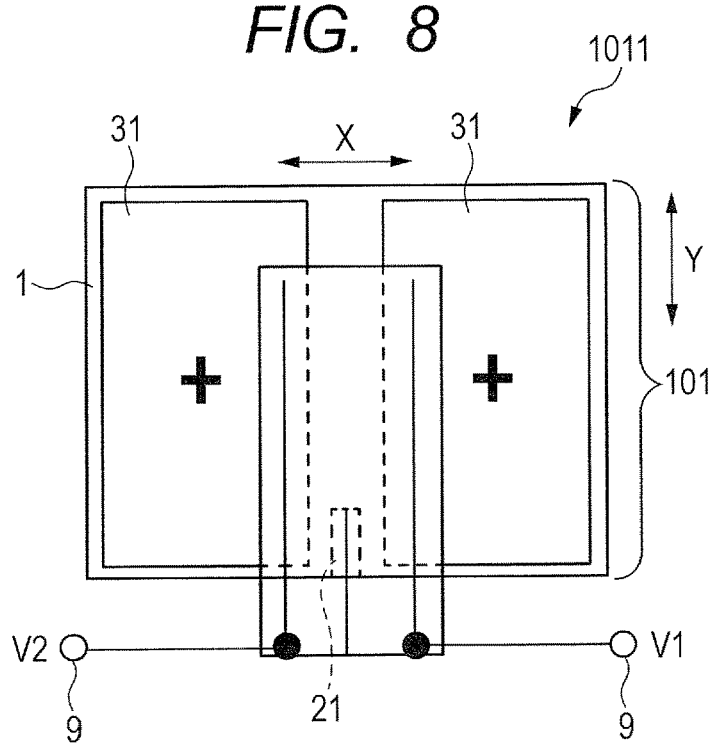
FIG. 8 is a schematic view for illustrating the oscillatory wave driving apparatus manufactured by the method of manufacturing an oscillatory wave driving apparatus according to the one embodiment of the present invention.

FIG. 7 and FIG. 8 are each a schematic view for illustrating an embodiment of the oscillatory wave driving apparatus manufactured by the manufacturing method of the present invention.

As illustrated in FIG. 7, a body to be driven (slider) 8 is arranged on the diaphragm 6 through intermediation of the protrusions 61. It is preferred that the two protrusions 61 be arranged symmetrically with respect to the XZ-plane or the YZ-plane passing through the center of the diaphragm 6. The reason for this is that the piezoelectric oscillator 1011 receives uniform reaction force from the body to be driven (slider) 8 in the protrusions 61. Here, it is preferred that the body to be driven (slider) 8 is brought into pressure contact with the tip ends of the protrusions 61. With this, the body to be driven (slider) 8 can move in the arrow directions through the elliptic motion of the protrusions 61.

As illustrated in FIG. 8, the voltage input unit 9 is arranged in order to apply a voltage to the piezoelectric oscillator 1011. An alternating voltage (V1) is applied to the drive phase electrode 31 positioned on the right side of the two drive phase electrodes 31 of the piezoelectric element 101, and an alternating voltage (V2) is applied to the drive phase electrode 31 positioned on the left side thereof. Here, the absolute values of amplitudes of the alternating voltages V1 and V2 are the same.

When the alternating voltages V1 and V2 are applied at a frequency in the vicinity of the resonant frequency of the A-mode, with the phase being shifted by 180°, the piezoelectric element 101 of the drive phase electrode 31 on the right side contracts, and the piezoelectric element 101 of the drive phase electrode 31 on the left side expands. Alternatively, the piezoelectric element 101 of the drive phase electrode 31 on the left side contracts, and the piezoelectric element 101 of the drive phase electrode 31 on the right side expands. As a result, in the piezoelectric oscillator 1011, the oscillation of the A-mode is generated. Further, when the alternating voltages V1 and V2 are applied at a frequency in the vicinity of the resonant frequency of the B-mode, with the phase being the same)(0°, the entire piezoelectric element 101 (drive phase electrode 31) expands or contracts at a certain moment. As a result, in the piezoelectric oscillator 1011, the oscillation of the B-mode is generated.

In this case, the phase difference between the alternating voltages V1 and V2 is set to a phase difference $\theta$ between 0° and 180° (0°<$\theta$<180°), the synthetic vectors of (V1+V2) and (V1−V2) are orthogonal to each other. This means that the oscillation of the A-mode and the oscillation of the B-mode are simultaneously generated, and the phase difference between the oscillations is 90°. As a result, elliptic motion can be caused in the protrusions 61 on the diaphragm 6, and the body to be driven (slider) 8 that is brought into contact with the protrusions 61 can be driven.

That is, when the voltage amplitudes of the alternating voltages V1 and V2 are set to be the same, and the phase difference $\theta$ between the alternating voltages V1 and V2 is set to 0°<$\theta$<180°, the oscillation of the A-mode and the oscillation of the B-mode can be simultaneously generated, and the phase difference between the oscillations becomes 90° or −90° without fail. Further, when the phase difference $\theta$ between the alternating voltages V1 and V2 is changed, the amplitudes of the A-mode and the B-mode can be changed.

(Method of Measuring Driving Characteristics of Oscillatory Wave Driving Apparatus)

Next, a method of measuring driving characteristics of the oscillatory wave driving apparatus is described.

First, the alternating voltages V1 and V2 are applied to the piezoelectric oscillator 1011. Here, the frequencies are the same, and the phase difference between the alternating voltages V1 and V2 is 90°. In this case, elliptic oscillation is generated in the protrusions 61 of the diaphragm 6. Then, the piezoelectric oscillator 1011 causes linear motion in one direction (forward direction) with respect to the fixed body to be driven (slider) 8. The driving speed, driving frequency, and power consumption in this case are referred to as "driving characteristics of oscillatory wave driving apparatus".

Meanwhile, the alternating voltages V1 and V2 are applied to the piezoelectric oscillator 1011, with the phase difference between the alternating voltages V1 and V2 being −90°. Then, linear motion occurs in a direction (backward direction) opposite to the direction when the phase difference is set to 90°. It is desired that the driving characteristics of the oscillatory wave driving apparatus be equivalent between the forward direction and the backward direction.

In the present invention, the driving characteristics of the oscillatory wave driving apparatus are defined to be equivalent when the following two conditions are satisfied.

(1) The ratio of the highest speed in the backward direction with respect to the highest speed in the forward direction falls within a range of 80% or more and 120% or less.

(2) The difference between the frequency at a time when the highest speed in the forward direction is achieved and the frequency at a time when the highest speed in the backward direction is achieved falls within a range of ±1 kHz.

Further, the oscillation characteristics of the piezoelectric oscillator may also be evaluated by the same principle as that of the above-mentioned measurement method.

Figure 9:
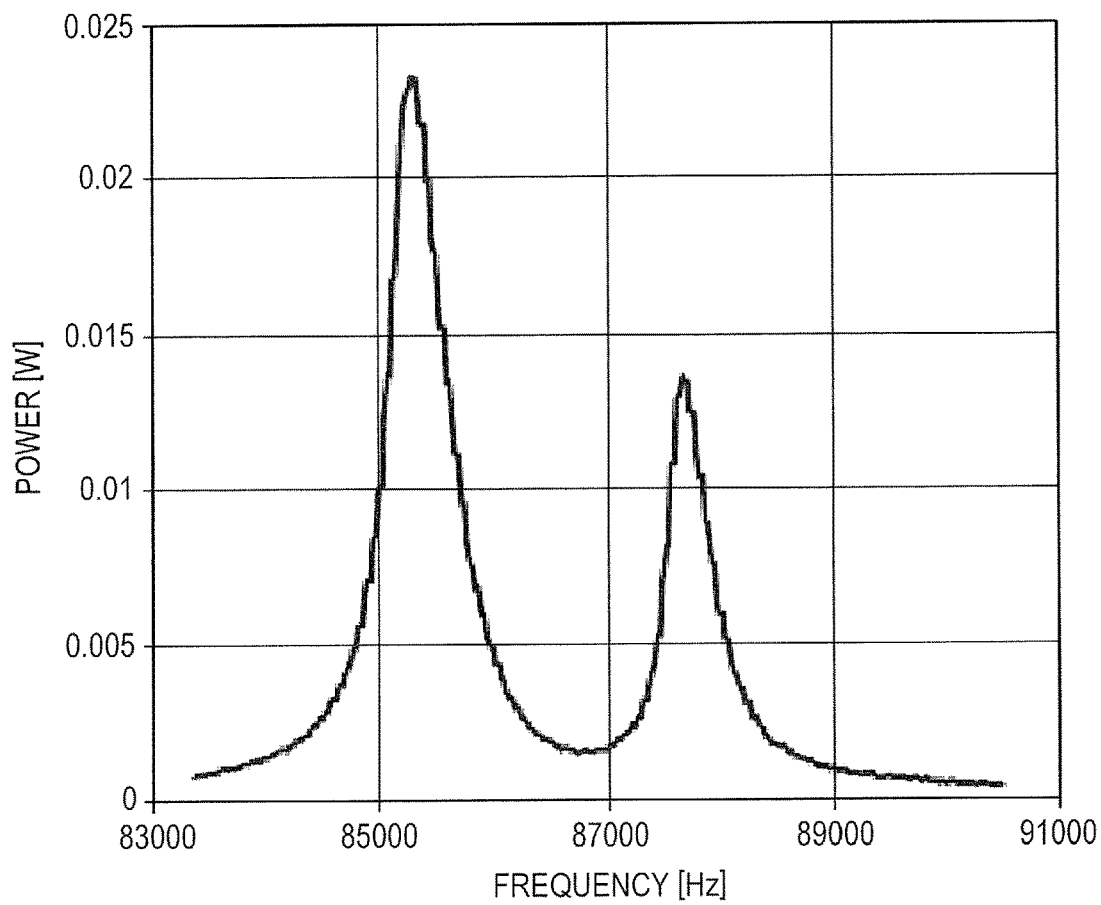
FIG. 9 is a graph for schematically showing frequency dependence of power consumption in a forward direction of the oscillator obtained by the method of manufacturing an oscillator according to the one embodiment of the present invention.

First, the alternating voltages V1 and V2 are applied to the piezoelectric oscillator 1011, with the phase difference between the alternating voltages V1 and V2 being −90°, and a frequency is swept. Then, a graph of power depending on the frequency can be drawn as shown in FIG. 9. FIG. 9 is a typical graph for showing frequency dependence of power consumption in the forward direction of the piezoelectric oscillator obtained by the manufacturing method of the present invention, and in this case, the amplitudes of the alternating voltages V1 and V2 are set to 10 Vpp. Two peaks appearing in this case correspond to the A-mode and the B-mode, respectively.

Next, the alternating voltages V1 and V2 are applied to the piezoelectric oscillator 1011, with the phase difference between the alternating voltages V1 and V2 being 90°, and a frequency is swept. Then, a graph of frequency dependence of power consumption in the backward direction is obtained in the same manner as in the case of the phase difference of −90°. It can be determined whether or not the oscillation characteristics exhibited by the piezoelectric oscillator 1011 are equivalent between the forward direction and the backward direction, by comparing the power consumption in the forward direction to that in the backward direction from the viewpoints of the maximum power consumption of the A-mode and the frequency (resonant frequency of the A-mode) in this case and the maximum power consumption of the B-mode and the frequency (resonant frequency of the B-mode) in this case.

In the present invention, the oscillation characteristics of the piezoelectric oscillator 1011 are defined to be equivalent when the following four conditions are satisfied.

(1) The ratio of the maximum power consumption in the backward direction of the A-mode with respect to the maximum power consumption in the forward direction of the A-mode falls within a range of 60% or more and 140% or less.

(2) The ratio of the maximum power consumption in the backward direction of the B-mode with respect to the maximum power consumption in the forward direction of the B-mode falls within a range of 60% or more and 140% or less.

(3) The difference between the resonant frequency in the forward direction of the A-mode and the resonant frequency in the backward direction of the A-mode falls within a range of ±50 Hz.

(4) The difference between the resonant frequency in the forward direction of the B-mode and the resonant frequency in the backward direction of the B-mode falls within a range of ±50 Hz.

(Method of Manufacturing Optical Apparatus)

A method of manufacturing an optical apparatus of the present invention is a method of manufacturing an optical apparatus including an oscillatory wave driving apparatus and an optical member. The method includes: manufacturing the oscillatory wave driving apparatus by the above-mentioned method of manufacturing an oscillatory wave driving apparatus; and dynamically connecting the oscillatory wave driving apparatus and the optical member to each other.

The expression "dynamically connecting" as used herein refers to a state in which one member is held in direct contact with the other member or held in contact with the other member through intermediation of a third member so that force generated by the coordinate variation, volume change, and shape change of one member is transmitted to the other member. When the oscillatory wave driving apparatus manufactured by the above-mentioned manufacturing method and the optical member are dynamically connected to each other, an optical apparatus having focus accuracy equivalent between the forward direction and the backward direction can be provided.

Figure 10:
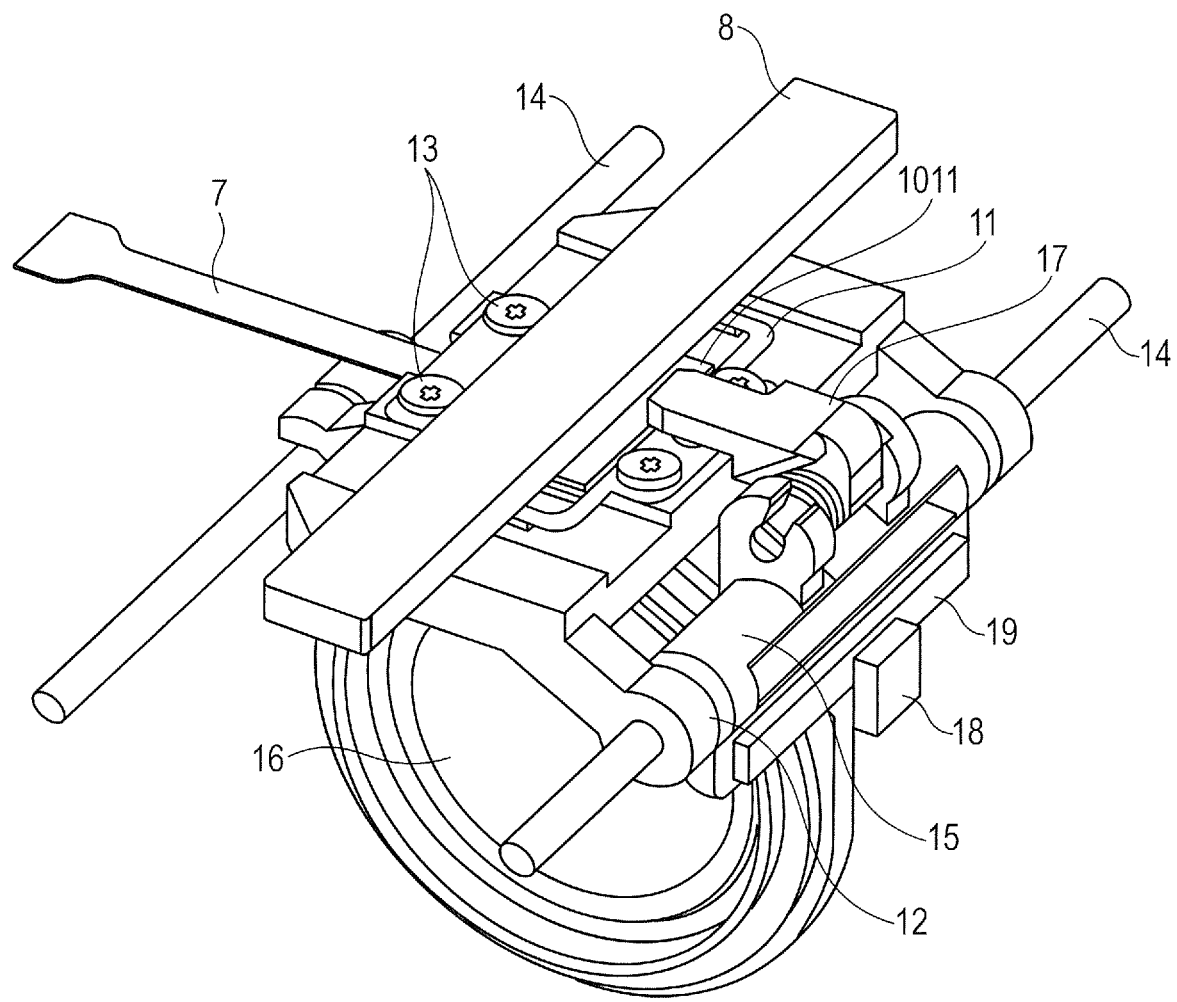
FIG. 10 is a schematic view for illustrating an optical apparatus manufactured by a method of manufacturing an optical apparatus according to one embodiment of the present invention.

FIG. 10 is a schematic view for illustrating an embodiment of an optical apparatus (focus lens portion of a lens barrel device) manufactured by the manufacturing method of the present invention. In FIG. 10, the body to be driven (slider) 8 is held in pressure contact with the piezoelectric oscillator 1011. Further, the power supply member 7 is bonded to the second electrode (not shown) of the piezoelectric oscillator 1011 by thermocompression bonding so as to be brought into conduction therewith through intermediation of the second adhesive portion (not shown). When a desired voltage is applied to the piezoelectric oscillator 1011 through the power supply member 7 by the voltage input unit (not shown), elliptic motion is caused in the protrusions (not shown) of the diaphragm 6.

A holding member 11 is fixed onto the piezoelectric oscillator 1011 through welding or the like so that unnecessary oscillation is not generated. A movable housing 12 is fixed onto the holding member 11 with screws 13 to be integrated with the piezoelectric oscillator 1011. Those members form an ultrasonic motor (oscillatory wave driving apparatus). When the movable housing 12 is mounted onto two guide members 14, the ultrasonic motor can move in a straight line in both directions (forward direction and backward direction) on the guide members 14.

Next, a lens 16 (optical member) serving as a focus lens of the lens barrel device is described. The lens 16 is fixed onto a lens holding member 15 and has an optical axis (not shown) parallel to the movement direction of the ultrasonic motor. The lens holding member 15 is configured to perform focus adjustment by moving in a straight line on the two guide members 14 described later in the same manner as the ultrasonic motor. The two guide members 14 are configured to fit the movable housing 12 and the lens holding member 15 with each other to enable the movable housing 12 and the lens holding member 15 to move in a straight line. With such configuration, the movable housing 12 and the lens holding member 15 can move in a straight line on the guide members 14.

Further, a coupling member 17 is configured to transmit the drive force generated in the ultrasonic motor to the lens holding member 15 and is mounted so as to be fitted with the lens holding member 15. With this, the lens holding member 15 can move in both directions along the two guide members 14 smoothly together with the movable housing 12.

Further, a sensor 18 is arranged in order to read positional information of a scale 19 mounted to a side surface portion of the lens holding member 15, to thereby detect the position of the lens holding member 15 on the guide member 14.

As described above, the above-mentioned respective members are incorporated to construct the focus lens portion of the lens barrel device.

In the foregoing, the lens barrel device for a single-lens reflex camera is described as the optical apparatus. However, the present invention can be applied to various optical apparatus including an oscillatory wave driving apparatus, such as a compact camera in which a lens and a camera body are integrated and an electronic still camera, irrespective of the kind of the camera.

EXAMPLES

Next, the method of manufacturing a piezoelectric oscillator, the method of manufacturing an oscillatory wave driving apparatus, and the method of manufacturing an optical apparatus of the present invention are described by way of Examples. However, the present invention is not limited by Examples. Examples are described with reference to the drawings through use of reference symbols in the drawings.

Method of Manufacturing Piezoelectric Oscillator

Example 1

First, metal oxide powder was sintered to provide the piezoelectric ceramics 1 free from being subjected to polarization treatment. The composition of the piezoelectric ceramics 1 was measured by fluorescent X-ray analysis (XRF). As a result, it was found that the piezoelectric ceramics 1 contained 0.16 part by weight of Mn in terms of a metal with respect to 100 parts by weight of $(Ba_{0.85}Ca_{0.15})(Ti_{0.93}Zr_{0.07})O_3$ and contained lead in a content of less than 1,000 ppm. That is, the piezoelectric ceramics 1 was a barium titanate based piezoelectric ceramics.

Then, in order to measure various parameters of the piezoelectric ceramics 1, Au electrodes were formed on both surfaces of the piezoelectric ceramics 1 by sputtering to manufacture a test piece piezoelectric element having a shape of $10 \times 2.5 \times 0.5$ mm$^3$, and the test piece piezoelectric element was polarized under conditions of a temperature of 100° C., an electric field of 1 kV/mm, and a time period of 30 minutes. The test piece piezoelectric element was evaluated and found to have a depolarization temperature Td of 104° C., a linear expansion coefficient ap at 20° C. of $8.1 \times 10^{-6}$/° C., a Young's modulus Yp of 126 GPa, and a piezoelectric constant $d_{31}$ of −90 pm/V.

Next, the piezoelectric ceramics 1 was substantially uniformly ground to a thickness of 0.34 mm and subjected to polishing, and then was cut to a size of $8.7 \times 5.7$ mm$^2$. The drive phase electrodes 31 and the ground electrode 21 as illustrated in FIG. 4B were formed on both surfaces of the piezoelectric ceramics 1 by screen printing through use of a silver paste, to thereby provide the piezoelectric element 101.

Next, as illustrated in FIG. 4A, the first adhesive portion 4 was formed between the ground electrode 21 of the piezoelectric element 101 and the diaphragm 6 at a temperature T1 of 160° C. As the diaphragm 6, magnetic stainless steel SUS420J2 under the JIS was used. The diaphragm 6 has dimensions of $9.0 \times 5.8 \times 0.3$ mm$^3$. Further, SUS420J2 is martensite-based stainless steel, and the composition thereof contains 70 mass % or more of steel and 12 mass % to 14 mass % of chromium. The linear expansion coefficient as at 20° C. of SUS420J2 is $10.0 \times 10^{-6}$/° C. and the Young's modulus Ys thereof is 204 GPa.

The first adhesive portion 4 was formed by applying an epoxy-based adhesive (glass transition temperature Tg1=120° C.) onto the diaphragm 6 with a dispenser and placing the diaphragm 6 into a constant-temperature chamber while the ground electrode surface of the piezoelectric element 101 and the diaphragm 6 were brought into pressure contact with each other, and keeping the resultant at 160° C. for 10 minutes. In this case, the piezoelectric element 101 and the diaphragm 6 were arranged so that centers of their respective adhesive surfaces were matched with each other, through use of a positioning jig.

Then, on a surface having the second electrode 3 of the piezoelectric element 101, on which the diaphragm 6 was not present, the second adhesive portion 5 was formed between the drive phase electrodes 31, the ground electrode 21, and the power supply member 7 by thermocompression bonding at a temperature T2 of 140° C. Specifically, the power supply member 7 formed of a flexible cable was connected to the piezoelectric element 101 through an anisotropic conductive film (ACF) containing a polymer material as a main component, the polymer material having a glass transition temperature Tg2 of 120° C. The conditions of thermocompression bonding were a time period of 10 seconds and a pressure of 2 MPa.

Then, the piezoelectric ceramics 1 was subjected to polarization treatment at a temperature T3 of 100° C. Specifically, contact pins for polarization were respectively brought into contact with the two drive phase electrodes 31 of the piezoelectric element 101, and a voltage was applied to the piezoelectric ceramics 1 with the diaphragm 6 being a ground. In this case, the intensity of an electric field applied to the piezoelectric ceramics 1 was 1.0 kV/mm and a time period of the application was 30 minutes.

Through the above-mentioned steps, ten piezoelectric oscillators 1011 (hereinafter referred to as "piezoelectric oscillators A") were obtained. In the obtained piezoelectric oscillators A, the ratio between the linear expansion coefficient as at 20° C. of the diaphragm 6 and the linear expansion coefficient ap at 20° C. of the piezoelectric ceramics 1 was αs/αp=1.23. Further, the ratio between the Young's modulus Ys at 20° C. of the diaphragm 6 and the Young's modulus Yp at 20° C. of the piezoelectric ceramics 1 was Ys/Yp=1.62.

Example 2

Ten piezoelectric oscillators B were obtained in the same steps as those of Example 1 except that the first adhesive portion 4 was formed between the ground electrode 21 of the piezoelectric element 101 and the diaphragm 6 at a temperature T1 of 140° C.

Example 3

Ten piezoelectric oscillators C were obtained in the same steps as those of Example 1 except that the first adhesive portion 4 was formed between the ground electrode 21 of the piezoelectric element 101 and the diaphragm 6 at a temperature T1 of 120° C.

Example 4

Ten piezoelectric oscillators D were obtained in the same steps as those of Example 2 except that the piezoelectric ceramics 1 was subjected to polarization treatment at a temperature T3 of 135° C.

Example 5

Ten piezoelectric oscillators E were obtained in the same steps as those of Example 1 except that an epoxy-based adhesive having a glass transition temperature Tg1 of 110° C. was used for the first adhesive portion 4.

Example 6

Ten piezoelectric oscillators F were obtained in the same steps as those of Example 1 except that, as the piezoelectric ceramics 1 free from being subjected to polarization treatment, a piezoelectric ceramics was obtained by firing metal oxide powder so that 0.14 part by weight of Mn in terms of a metal and 0.20 part by weight of Bi in terms of a metal were contained with respect to 100 parts by weight of $(Ba_{0.86}Ca_{0.14})(Ti_{0.93}Zr_{0.06})O_3$, and the content of lead was less than 1,000 ppm.

The piezoelectric ceramics 1 was a barium titanate based piezoelectric ceramics. Then, in order to measure various parameters of the piezoelectric ceramics 1, Au electrodes were formed on both surfaces of the piezoelectric ceramics 1 by sputtering to manufacture a test piece piezoelectric element having a shape of 10×2.5×0.5 mm$^3$, and the test piece piezoelectric element was polarized under conditions of a temperature of 100° C., an electric field of 1 kV/mm, and a time period of 30 minutes. The test piece piezoelectric element was evaluated and found to have a depolarization temperature Td of 106° C., a linear expansion coefficient αp at 20° C. of $7.8 \times 10^{-6}$/° C., a Young's modulus Yp of 117 GPa, and a piezoelectric constant $d_{31}$ of −100 pm/V.

In the obtained piezoelectric oscillators F, the ratio between the linear expansion coefficient αs at 20° of the diaphragm 6 and the linear expansion coefficient αp at 20° C. of the piezoelectric ceramics 1 was αs/αp=1.28. Further, the ratio between the Young's modulus Ys at 20° C. of the diaphragm 6 and the Young's modulus Yp at 20° C. of the piezoelectric ceramics 1 was Ys/Yp=1.74.

Example 7

Ten piezoelectric oscillators G were obtained in the same steps as those of Example 6 except that the first adhesive portion 4 was formed between the ground electrode 21 of the piezoelectric element 101 and the diaphragm 6 at a temperature T1 of 120° C.

Example 8

Ten piezoelectric oscillators H were obtained in the same steps as those of Example 1 except that as the piezoelectric ceramics 1 free from being subjected to polarization treatment, a piezoelectric ceramics was obtained by firing metal oxide powder so that 0.10 part by weight of Mn in terms of a metal was contained with respect to 100 parts by weight of $(Na_{0.88}Ba_{0.12})(Nb_{0.88}Ti_{0.12})O_3$, and the content of lead was less than 1,000 ppm, and the piezoelectric ceramics 1 was subjected to polarization treatment at a temperature T3 of 135° C.

The piezoelectric ceramics 1 was a barium titanate based piezoelectric ceramics. Then, in order to measure various parameters of the piezoelectric ceramics 1, Au electrodes were formed on both surfaces of the piezoelectric ceramics 1 by sputtering to manufacture a test piece piezoelectric element having a shape of 10×2.5×0.5 mm$^3$, and the test piece piezoelectric element was polarized under conditions of a temperature of 135° C., an electric field of 1 kV/mm, and a time period of 30 minutes. The test piece piezoelectric element was evaluated and found to have a depolarization temperature Td of 170° C., a linear expansion coefficient αp at 20° C. of $8.4 \times 10^{-6}$/° C., a Young's modulus Yp of 131 GPa, and a piezoelectric constant $d_{31}$ of −60 pm/V.

In the obtained piezoelectric oscillators H, the ratio between the linear expansion coefficient αs at 20° of the diaphragm 6 and the linear expansion coefficient αp at 20° C. of the piezoelectric ceramics 1 was αs/αp=1.19. Further, the ratio between the Young's modulus Ys at 20° C. of the diaphragm 6 and the Young's modulus Yp at 20° C. of the piezoelectric ceramics 1 was Ys/Yp=1.56.

Example 9

Ten piezoelectric oscillators I were obtained in the same steps as those of Example 8 except that: as the piezoelectric ceramics 1 free from being subjected to polarization treatment, a piezoelectric ceramics was obtained by firing metal oxide powder so that 0.20 part by weight of Mn in terms of a metal was contained with respect to 100 parts by weight of $(Na_{0.90}Ba_{0.10})(Nb_{0.88}Ti_{0.12})O_3$, and the content of lead was less than 1,000 ppm; on a surface of the piezoelectric element 101, on which the diaphragm 6 was not present, the second adhesive portion 5 was formed between the drive phase electrodes 31, the ground electrode 21, and the power supply member 7 by thermocompression bonding at a temperature T2 of 135° C.; and the piezoelectric ceramics 1 was subjected to polarization treatment at a temperature T3 of 130° C.

The piezoelectric ceramics 1 was a barium titanate based piezoelectric ceramics. Then, in order to measure various parameters of the piezoelectric ceramics 1, Au electrodes were formed on both surfaces of the piezoelectric ceramics 1 by sputtering to manufacture a test piece piezoelectric element having a shape of 10×2.5×0.5 mm$^3$, and the test piece piezoelectric element was polarized under conditions of a temperature of 130° C., an electric field of 1 kV/mm, and a time period of 30 minutes. The test piece piezoelectric element was evaluated and found to have a depolarization temperature Td of 190° C., a linear expansion coefficient αp at 20° C. of $8.3 \times 10^{-6}$/° C., a Young's modulus Yp of 128 GPa, and a piezoelectric constant $d_{31}$ of −65 pm/V.

In the obtained piezoelectric oscillators I, the ratio between the linear expansion coefficient αs at 20° of the diaphragm 6 and the linear expansion coefficient αp at 20° C. of the piezoelectric ceramics 1 was αs/αp=1.20. Further, the ratio between the Young's modulus Ys at 20° C. of the diaphragm 6 and the Young's modulus Yp at 20° C. of the piezoelectric ceramics 1 was Ys/Yp=1.59.

Comparative Example 1

First, metal oxide powder was sintered to provide the piezoelectric ceramics 1 free from being subjected to polarization treatment.

The composition of the piezoelectric ceramics 1 was measured by fluorescent X-ray analysis (XRF). As a result, it was found that the piezoelectric ceramics 1 contained 0.16 part by weight of Mn in terms of a metal with respect to 100 parts by weight of $(Ba_{0.85}Ca_{0.15})(Ti_{0.93}Zr_{0.07})O_3$, and the content of lead was less than 1,000 ppm. That is, the piezoelectric ceramics 1 was a barium titanate based piezoelectric ceramics.

Then, in order to measure various parameters of the piezoelectric ceramics 1, Au electrodes were formed on both surfaces of the piezoelectric ceramics 1 by sputtering to manufacture a test piece piezoelectric element having a shape of 10×2.5×0.5 mm$^3$, and the test piece piezoelectric element was polarized under conditions of a temperature of 100° C., an electric field of 1 kV/mm, and a time period of 30 minutes. The test piece piezoelectric element was evaluated and found to have a depolarization temperature Td of 104° C., a linear expansion coefficient αp at 20° C. of $8.1 \times 10^{-6}$/° C., a Young's modulus Yp of 126 GPa, and a piezoelectric constant $d_{31}$ of −90 pm/V.

Next, the piezoelectric ceramics 1 was substantially uniformly ground to a thickness of 0.34 mm and subjected to polishing, and then was cut to a size of 8.7×5.7 mm². The drive phase electrodes 31 and the ground electrode 21 as illustrated in FIG. 4B were formed on both surfaces of the piezoelectric ceramics 1 by screen printing through use of a silver paste, to thereby provide the piezoelectric element 101.

Then, the piezoelectric ceramics 1 was subjected to polarization treatment at a temperature T3 of 100° C. Specifically, contact pins for polarization were respectively brought into contact with the two drive phase electrodes 31 of the piezoelectric element 101, and a voltage was applied to the piezoelectric ceramics 1 with the diaphragm 6 being a ground. In this case, the intensity of an electric field applied to the piezoelectric ceramics 1 was 1.0 kV/mm and a time period of the application was 30 minutes.

Next, as illustrated in FIG. 3, the first adhesive portion 4 was formed between the ground electrode 21 of the piezoelectric element 101 and the diaphragm 6 at a temperature T1 of 160° C. As the diaphragm 6, magnetic stainless steel SUS420J2 under the JIS was used. The diaphragm 6 has dimensions of 9.0×5.8×0.3 mm³. Further, SUS420J2 is martensite-based stainless steel, and the composition thereof contains 70 mass % or more of steel and 12 mass % to 14 mass % of chromium. The linear expansion coefficient as at 20° C. of SUS420J2 is $10.0 \times 10^{-6}/°$ C. and the Young's modulus Ys thereof is 204 GPa.

The first adhesive portion 4 was formed by applying an epoxy-based adhesive (glass transition temperature Tg1=120° C.) onto the diaphragm 6 with a dispenser and placing the diaphragm 6 into a constant-temperature chamber while the ground electrode surface of the piezoelectric element 101 and the diaphragm 6 were brought into pressure contact with each other, and keeping the resultant at 160° C. for 10 minutes. In this case, the piezoelectric element 101 and the diaphragm 6 were arranged so that centers of their respective adhesive surfaces were matched with each other, through use of a positioning jig.

Then, on a surface of the piezoelectric element 101, on which the diaphragm 6 was not present, the second adhesive portion 5 was formed between the drive phase electrodes 31, the ground electrode 21, and the power supply member 7 by thermocompression bonding at a temperature T2 of 140° C. Specifically, the power supply member 7 formed of a flexible cable was connected to the piezoelectric element 101 through an anisotropic conductive film (ACF) containing a polymer material as a main component, the polymer material having a glass transition temperature Tg2 of 120° C. The conditions of thermocompression bonding were a time period of 10 seconds and a pressure of 2 MPa.

Then, the piezoelectric ceramics 1 was subjected to polarization treatment at a temperature T3 of 100° C. Specifically, contact pins for polarization were respectively brought into contact with the two drive phase electrodes 31 of the piezoelectric element 101, and a voltage was applied to the piezoelectric ceramics 1 with the diaphragm 6 being a ground. In this case, the intensity of an electric field applied to the piezoelectric ceramics 1 was 1.0 kV/mm and a time period of the application was 30 minutes.

Through the above-mentioned steps, ten piezoelectric oscillators 1011 (hereinafter referred to as "piezoelectric oscillators J") were obtained. In the obtained piezoelectric oscillators J, the ratio between the linear expansion coefficient as at 20° C. of the diaphragm 6 and the linear expansion coefficient $\alpha p$ at 20° C. of the piezoelectric ceramics 1 was $\alpha s/\alpha p=1.23$. Further, the ratio between the Young's modulus Ys at 20° C. of the diaphragm 6 and the Young's modulus Yp at 20° C. of the piezoelectric ceramics 1 was Ys/Yp=1.62.

Comparative Example 2

Ten piezoelectric oscillators K were obtained in the same steps as those of Example 1 except that the first adhesive portion 4 was formed between the ground electrode 21 of the piezoelectric element 101 and the diaphragm 6 at a temperature T1 of 120° C., and the piezoelectric ceramics 1 was subjected to polarization treatment at a temperature T3 of 135° C.

Comparative Example 3

Ten piezoelectric oscillators L were obtained in the same steps as those of Example 1 except that: the first adhesive portion 4 was formed between the ground electrode 21 of the piezoelectric element 101 and the diaphragm 6 at a temperature T1 of 120° C.; the power supply member 7 containing a thermosetting resin was bonded to the drive phase electrodes 31 and the ground electrode 21 of the piezoelectric element 101 by thermocompression bonding at a temperature T2 of 100° C.; the piezoelectric element 101 was subjected to polarization treatment at a temperature T3 of 100° C.; and an epoxy-based adhesive having a glass transition temperature Tg of 110° C. was used.

Comparative Example 4

Ten piezoelectric oscillators M were obtained in the same steps as those of Example 1 except that a piezoelectric ceramics containing 0.10 part by weight of Mn in terms of a metal with respect to 100 parts by weight of $(Pb_{0.98}Sr_{0.02})(Zr_{0.55}Ti_{0.45})O_3$ was used as the piezoelectric ceramics 1, and the piezoelectric element 101 was subjected to polarization treatment at a temperature T3 of 170° C.

The piezoelectric ceramics 1 is a lead-based piezoelectric ceramics. Further, the piezoelectric ceramics 1 has a depolarization temperature Td of 300° C., a linear expansion coefficient $\alpha p$ at 20° C. of $4.0 \times 10^{-6}/°$ C., a Young's modulus Yp of 85 GPa, and a piezoelectric constant $d_{31}$ of −130 pm/V.

In the obtained piezoelectric oscillators M, the ratio between the linear expansion coefficient as at 20° C. of the diaphragm 6 and the linear expansion coefficient $\alpha p$ at 20° C. of the piezoelectric ceramics 1 was $\alpha s/\alpha p=2.50$. Further, the ratio between the Young's modulus Ys at 20° C. of the diaphragm 6 and the Young's modulus Yp at 20° C. of the piezoelectric ceramics 1 was Ys/Yp=2.40.

Comparative Example 5

Ten piezoelectric oscillators N were obtained in the same steps as those in Comparative Example 4 except that, on a surface of the piezoelectric element 101, on which the diaphragm 6 was not present, the second adhesive portion 5 was formed between the drive phase electrodes 31, the ground electrode 21, and the power supply member 7 by thermocompression bonding at a temperature T2 of 180° C., and the piezoelectric ceramics 1 was subjected to polarization treatment at a temperature T3 of 160° C.

The manufacturing conditions of Examples and Comparative Examples are shown in Table 1.

TABLE 1

| | Manufacturing method | | | | Adhesive portion | | Diaphragm | | | Piezoelectric ceramics | | | | Piezoelectric oscillator | |
|---|---|---|---|---|---|---|---|---|---|---|---|---|---|---|---|
| | Presence or absence of polarization | T1 [°C.] | T2 [°C.] | T3 [°C.] | Tg1 [°C.] | Tg2 [°C.] | Com-position | αs [10⁻⁶/°C.] | Ys [10⁹ Pa] | Com-position | Td [°C.] | Ap [10⁻⁶/°C.] | Yp [10⁹ Pa] | αs/αp | Ys/Yp |
| Example 1 | Absent | 160 | 140 | 100 | 120 | 120 | SUS420J2 | 10.0 | 204 | BCTZ1 | 104 | 8.1 | 126 | 1.23 | 1.62 |
| Example 2 | Absent | 140 | 140 | 100 | 120 | 120 | SUS420J2 | 10.0 | 204 | BCTZ1 | 104 | 8.1 | 126 | 1.23 | 1.62 |
| Example 3 | Absent | 120 | 140 | 100 | 120 | 120 | SUS420J2 | 10.0 | 204 | BCTZ1 | 104 | 8.1 | 126 | 1.23 | 1.62 |
| Example 4 | Absent | 140 | 140 | 135 | 120 | 120 | SUS420J2 | 10.0 | 204 | BCTZ1 | 104 | 8.1 | 126 | 1.23 | 1.62 |
| Example 5 | Absent | 160 | 140 | 100 | 110 | 120 | SUS420J2 | 10.0 | 204 | BCTZ1 | 104 | 8.1 | 126 | 1.23 | 1.62 |
| Example 6 | Absent | 160 | 140 | 100 | 120 | 120 | SUS420J2 | 10.0 | 204 | BCTZ2 | 106 | 7.8 | 117 | 1.28 | 1.74 |
| Example 7 | Absent | 120 | 140 | 100 | 120 | 120 | SUS420J2 | 10.0 | 204 | BCTZ2 | 106 | 7.8 | 117 | 1.28 | 1.74 |
| Example 8 | Absent | 160 | 140 | 135 | 120 | 120 | SUS420J2 | 10.0 | 204 | NNBT1 | 170 | 8.4 | 131 | 1.19 | 1.56 |
| Example 9 | Absent | 160 | 135 | 130 | 120 | 120 | SUS420J2 | 10.0 | 204 | NNBT2 | 190 | 8.3 | 128 | 1.20 | 1.59 |
| Comparative Example 1 | Present | 160 | 140 | 100 | 120 | 120 | SUS420J2 | 10.0 | 204 | BCTZ1 | 110 | 8.1 | 126 | 1.23 | 1.62 |
| Comparative Example 2 | Absent | 120 | 140 | 135 | 120 | 120 | SUS420J2 | 10.0 | 204 | BCTZ1 | 110 | 8.1 | 126 | 1.23 | 1.62 |
| Comparative Example 3 | Absent | 120 | 100 | 100 | 110 | 120 | SUS420J2 | 10.0 | 204 | BCTZ1 | 110 | 8.1 | 126 | 1.23 | 1.62 |
| Comparative Example 4 | Absent | 160 | 140 | 170 | 120 | 120 | SUS420J2 | 10.0 | 204 | PZT | 300 | 4.0 | 85 | 2.50 | 2.40 |
| Comparative Example 5 | Absent | 160 | 180 | 160 | 120 | 120 | SUS420J2 | 10.0 | 204 | PZT | 300 | 4.0 | 85 | 2.50 | 2.40 |

(Evaluation of Piezoelectric Oscillator)

Each obtained piezoelectric oscillator was evaluated for frequency dependence of power consumption. Specifically, an alternating voltage of 10.0 Vpp was applied to each of the two drive phase electrodes 31 (hereinafter referred to as "A-phase" and "B-phase" for convenience of description) while a frequency was swept. The phase difference of the voltage between the A-phase and the B-phase in this case was set to −90° and 90°. The case of −90° is hereinafter referred to as "forward direction", and the case of 90° is hereinafter referred to as "backward direction". The power consumption in the forward direction and the backward direction in this case was evaluated through use of an oscilloscope (DL850E (trade name) manufactured by Yokogawa Meters and Instruments Corporation).

Regarding those results, how many piezoelectric oscillators of the ten manufactured piezoelectric oscillators satisfied the following conditions (1), (2), (3), and (4) is shown in Table 2.

(Conditions)

(1) The ratio of the maximum power consumption in the backward direction of the A-mode with respect to the maximum power consumption in the forward direction of the A-mode falls within a range of 60% or more and 140% or less.

(2) The difference between the resonant frequency in the forward direction of the A-mode and the resonant frequency in the backward direction of the A-mode falls within a range of ±50 Hz.

(3) The ratio of the maximum power consumption in the backward direction of the B-mode with respect to the maximum power consumption in the forward direction of the B-mode falls within a range of 60% or more and 140% or less.

(4) The difference between the resonant frequency in the forward direction of the B-mode and the resonant frequency in the backward direction of the B-mode falls within a range of ±50 Hz.

TABLE 2

| | | A-mode | | B-mode | | |
|---|---|---|---|---|---|---|
| | | (1) Power consumption | (2) Resonant frequency | (3) Power consumption | (4) Resonant frequency | Non-defective rate |
| Example 1 | Piezoelectric oscillator A | 100% | 100% | 100% | 100% | 100% |
| Example 2 | Piezoelectric oscillator B | 90% | 100% | 100% | 100% | 90% |
| Example 3 | Piezoelectric oscillator C | 100% | 100% | 90% | 100% | 90% |
| Example 4 | Piezoelectric oscillator D | 80% | 90% | 90% | 90% | 80% |
| Example 5 | Piezoelectric oscillator E | 100% | 100% | 100% | 100% | 100% |
| Example 6 | Piezoelectric oscillator F | 100% | 100% | 100% | 100% | 100% |
| Example 7 | Piezoelectric oscillator G | 90% | 100% | 90% | 100% | 90% |
| Example 8 | Piezoelectric oscillator H | 90% | 100% | 80% | 100% | 80% |
| Example 9 | Piezoelectric oscillator I | 90% | 90% | 90% | 90% | 80% |

TABLE 2-continued

|  |  | A-mode | | B-mode | | |
|---|---|---|---|---|---|---|
|  |  | (1) Power consumption | (2) Resonant frequency | (3) Power consumption | (4) Resonant frequency | Non-defective rate |
| Comparative Example 1 | Piezoelectric oscillator J | 30% | 50% | 40% | 50% | 40% |
| Comparative Example 2 | Piezoelectric oscillator K | 50% | 70% | 60% | 70% | 50% |
| Comparative Example 3 | Piezoelectric oscillator L | 60% | 70% | 50% | 60% | 50% |
| Comparative Example 4 | Piezoelectric oscillator M | 60% | 70% | 60% | 70% | 60% |
| Comparative Example 5 | Piezoelectric oscillator N | 60% | 80% | 60% | 80% | 60% |

First, the non-defective rate of each of the piezoelectric oscillators A, E, and F was 100%. Next, the non-defective rate of each of the piezoelectric oscillators B, C, and G was 90%. The non-defective rate of each of the piezoelectric oscillators B, C, and G was slightly lower than that of each of the piezoelectric oscillators A, E, and F. The reason for this is considered as follows. The relationships T1>T3 and T2>T3 were satisfied, but the relationship T1>T2>T3 was not satisfied.

The non-defective rate of each of the piezoelectric oscillators D, H, and I was 80%. The non-defective rate of each of the piezoelectric oscillators D, H, and I was slightly lower than that of each of the piezoelectric oscillators A, E, and F. The reasons for this are considered as follows. Although the piezoelectric oscillators D, H, and I satisfied the relationships T1>T3 and T2>T3, the piezoelectric oscillator D did not satisfy the relationship Tg1>T3, and did not satisfy the relationship T1>T2>T3. Further, the piezoelectric oscillators H and I did not satisfy the relationship Tg1>T3, and did not satisfy the relationship T2≥Td.

Meanwhile, the non-defective rate of each of the piezoelectric oscillators J, K, L, M, and N was 60% or less. None of those piezoelectric oscillators satisfied the relationships T1>T3 and T2>T3. Of those, the piezoelectric oscillator J was manufactured through use of the piezoelectric ceramics subjected to polarization treatment, and hence the non-defective rate thereof was 40%, which was the lowest non-defective rate.

Thus, the non-defective rate of each of all the piezoelectric oscillators manufactured by the manufacturing method of the present invention was 80% or more, whereas the non-defective rate of each of the piezoelectric oscillators manufactured by the manufacturing method according to Comparative Examples was 60% or less.

Method of Manufacturing Oscillatory Wave Driving Apparatus

Examples 10 to 18

The diaphragm 6 of each of the piezoelectric oscillators A to I manufactured in Examples 1 to 9 was arranged so as to be brought into contact with the body to be driven (slider) 8, to thereby manufacture an oscillatory wave driving apparatus as illustrated in FIG. 7 and FIG. 8 (Examples 10 to 18). An alternating voltage having an amplitude of 100 Vpp was applied to each of the A-phase and the B-phase of the manufactured oscillatory wave driving apparatus while a frequency was swept. The phase difference of the voltage between the A-phase and the B-phase in this case was set to −90° and 90°. The highest speed of the piezoelectric oscillator 1011 in this case and the frequency at the highest speed were measured with the sensor 18.

Oscillatory wave driving apparatus as illustrated in FIG. 7 and FIG. 8 were manufactured and evaluated in the same steps as those of Examples 10 to 18 through use of the piezoelectric oscillators J to N manufactured in Comparative Examples 1 to 5.

Comparative Examples 6 to 10

Regarding those results, how many oscillatory wave driving apparatus of the ten manufactured oscillatory wave driving apparatus satisfied the following conditions (5) and (6) is shown in Table 3.

(Conditions)

(5) The ratio of the highest speed in the backward direction with respect to the highest speed in the forward direction falls within a range of 80% or more and 120% or less.

(6) The difference between the frequency at a time when the highest speed in the forward direction is achieved and the frequency at a time when the highest speed in the backward direction is achieved falls within a range of ±1 kHz.

TABLE 3

|  |  | (5) Highest speed | (6) Frequency | Non-defective rate |
|---|---|---|---|---|
| Example 10 | Piezoelectric oscillator A | 100% | 100% | 100% |
| Example 11 | Piezoelectric oscillator B | 90% | 100% | 90% |
| Example 12 | Piezoelectric oscillator C | 90% | 100% | 90% |
| Example 13 | Piezoelectric oscillator D | 80% | 90% | 80% |
| Example 14 | Piezoelectric oscillator E | 100% | 100% | 100% |
| Example 15 | Piezoelectric oscillator F | 100% | 100% | 100% |
| Example 16 | Piezoelectric oscillator G | 90% | 100% | 90% |
| Example 17 | Piezoelectric oscillator H | 80% | 100% | 80% |
| Example 18 | Piezoelectric oscillator I | 90% | 90% | 80% |
| Comparative Example 6 | Piezoelectric oscillator J | 30% | 50% | 40% |
| Comparative Example 7 | Piezoelectric oscillator K | 50% | 70% | 50% |
| Comparative Example 8 | Piezoelectric oscillator L | 50% | 60% | 50% |

TABLE 3-continued

| | | (5) Highest speed | (6) Frequency | Non-defective rate |
|---|---|---|---|---|
| Comparative Example 9 | Piezoelectric oscillator M | 60% | 70% | 60% |
| Comparative Example 10 | Piezoelectric oscillator N | 60% | 80% | 60% |

First, the non-defective rate of each of the oscillatory wave driving apparatus manufactured in Examples 10, 14, and 15 was 100%.

Next, the non-defective rate of each of the oscillatory wave driving apparatus manufactured in Examples 11, 12, and 16 was 90%. The non-defective rate of each of Examples 11, 12, and 16 was slightly lower than that of each of Examples 10, 14, and 15. The reason for this is considered as follows. Although the relationships T1>T3 and T2>T3 were satisfied, the relationship T1>T2>T3 was not satisfied.

The non-defective rate of each of the oscillatory wave driving apparatus manufactured in Examples 13, 17, and 18 was 80%. The non-defective rate of each of the oscillatory wave driving apparatus manufactured in Examples 13, 17, and 18 was slightly lower than that of each of Examples 10, 14, and 15. The reasons for this are considered as follows. Although Examples 13, 17, and 18 satisfied the relationships T1>T3 and T2>T3, Example 13 did not satisfy the relationship Tg1>T3, and did not satisfy the relationship T1>T2>T3. Examples 17 and 18 did not satisfy the relationship Tg1>T3, and did not satisfy the relationship T2≤Td.

Meanwhile, the non-defective rate of each of the oscillatory wave driving apparatus manufactured in Comparative Examples 6 to 10 was 60% or less. None of those oscillatory wave driving apparatus satisfied the relationships T1>T3 and T2>T3. Of those, the oscillatory wave driving apparatus of Comparative Example 6 was manufactured through use of the piezoelectric ceramics subjected to polarization treatment, and hence the non-defective rate thereof was 40%, which was the lowest non-defective rate.

Thus, the non-defective rate of each of all the oscillatory wave driving apparatus manufactured by the manufacturing method of the present invention was 80% or more, whereas the non-defective rate of each of the oscillatory wave driving apparatus manufactured by the manufacturing method according to Comparative Examples was 60% or less.

Method of Manufacturing Optical Apparatus

Example 19 and Comparative Example 11

The oscillatory wave driving apparatus manufactured in Example 10 and an optical member were dynamically connected to each other, to thereby manufacture an optical apparatus as illustrated in FIG. 10 (Example 19). Further, the oscillatory wave driving apparatus manufactured in Comparative Example 6 and an optical member were dynamically connected to each other, to thereby manufacture an optical apparatus as illustrated in FIG. 10 (Comparative Example 11). In both the optical apparatus, an autofocus operation depending on the application of an alternating voltage was confirmed. However, the focus operation of Example 19 had a small difference in focus time between the forward direction and the backward direction as compared to the focus operation of Comparative Example 11.

INDUSTRIAL APPLICABILITY

The method of manufacturing a piezoelectric oscillator of the present invention can provide a piezoelectric oscillator, in which the oscillation characteristics are equivalent between the forward direction and the backward direction, with good yield. Further, the method of manufacturing an oscillatory wave driving apparatus and the method of manufacturing an optical apparatus of the present invention can provide an oscillatory wave driving apparatus and an optical apparatus, in each of which the driving characteristics are equivalent between the forward direction and the backward direction, with good yield. Further, those manufacturing methods can be applied to all the piezoelectric devices having a mechanism of being driven in the forward direction and the backward direction, besides the oscillatory wave driving apparatus and the optical apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-061295, filed Mar. 25, 2016, which is hereby incorporated by reference herein in its entirety.

REFERENCE SIGNS LIST

1 piezoelectric ceramics
101 piezoelectric element
1011 piezoelectric oscillator
2 first electrode
21 ground electrode
3 second electrode
31 drive phase electrode
4 first adhesive portion
5 second adhesive portion
6 diaphragm
61 protrusion
7 power supply member
7a electric wiring
8 body to be driven (slider)
9 voltage input unit
11 holding member
12 movable housing
13 screw
14 guide member

The invention claimed is:

1. A method of manufacturing an oscillator, comprising, in sequence:
    arranging an electrode on a piezoelectric ceramic free from being subjected to polarization treatment, to thereby provide a piezoelectric element;
    bonding the piezoelectric element and an elastic body to each other at a temperature T1;
    bonding the piezoelectric element and a power supply member to each other at a temperature T2; and
    subjecting the piezoelectric ceramic to polarization treatment at a temperature T3,
    wherein the temperature T1, the temperature T2, and the temperature T3 satisfy a relationship T1>T2>T3.

2. The method according to claim 1, further comprising providing a first adhesive portion having a glass transition temperature Tg1 between the piezoelectric element and the elastic body and a second adhesive portion having a glass transition temperature Tg2 between the piezoelectric element and the power supply member, and wherein the glass transition temperature Tg1, the glass transition temperature Tg2, and the temperature T3 satisfy a relationship Tg1>T3 and a relationship Tg2>T3.

3. The method according to claim 1, wherein the temperature T1 is 20° C. to less than 600° C.

4. The method according to claim 1, wherein the temperature T3 is 20° C. or more.

5. The method according to claim 1, wherein the piezoelectric ceramic has a depolarization temperature Td, and the depolarization temperature Td and the temperature T2 satisfy a relationship T2>Td.

6. The method according to claim 5, wherein the depolarization temperature Td is 120° C. or less.

7. The method according to claim 1, wherein the elastic body has a linear expansion coefficient αs at 20° C. of $9.0 \times 10^{-6}/°$ C. to $20.0 \times 10^{-6}/°$ C.

8. The method according to claim 7, wherein the piezoelectric ceramic has a linear expansion coefficient αp at 20° C., and the linear expansion coefficient αs and the linear expansion coefficient αp satisfy a relationship 0.5≤αs/αp≤1.5.

9. The method according to claim 1, wherein the elastic body comprises an alloy containing 50 mass % or more of steel and 10.5 mass % or more of chromium.

10. The method according to claim 1, wherein the piezoelectric ceramic contains lead in a content of less than 1,000 ppm.

11. The method according to claim 1, wherein the elastic body has a Young's modulus Ys at 20° C. and the piezoelectric ceramic has a Young's modulus Yp at 20° C., and the Young's modulus Ys and the Young's modulus Yp satisfy a relationship 0.5≤Ys/Yp≤2.

12. The method according to claim 1, wherein the piezoelectric ceramic comprises a barium titanate based material.

13. The method according to claim 1, wherein the piezoelectric ceramic has a rectangular parallelepiped shape, and
wherein the oscillator is configured to generate composite oscillation of a combination of two out-of-plane oscillation modes in which nodal lines are substantially orthogonal to each other.

14. The method according to claim 1, wherein the piezoelectric element comprises two drive phase electrodes in portions with which the power supply member is brought into contact, and
wherein the piezoelectric ceramic has the same polarity in the portions that are brought into contact with the two drive phase electrodes.

* * * * *